United States Patent
Onizuka et al.

(10) Patent No.: US 7,167,377 B2
(45) Date of Patent: Jan. 23, 2007

(54) CIRCUIT-CONSTITUTING UNIT AND METHOD OF PRODUCING THE SAME

(75) Inventors: Takahiro Onizuka, Aichi (JP); Isao Isshiki, Nagoya (JP); Ryuji Nakanishi, Aichi (JP); Kouichi Takagi, Aichi (JP); Tou Chin, Aichi (JP); Shigeki Yamane, Aichi (JP)

(73) Assignees: Sumitoo Wiring Systems, Ltd., Mie (JP); Autonetworks Technologies, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 424 days.

(21) Appl. No.: 10/302,968

(22) Filed: Nov. 25, 2002

(65) Prior Publication Data
US 2003/0137813 A1    Jul. 24, 2003

(30) Foreign Application Priority Data

Nov. 26, 2001 (JP) ............................. 2001-359281
Jan. 28, 2002 (JP) ............................. 2002-018151

(51) Int. Cl.
H01R 9/00 (2006.01)
(52) U.S. Cl. ............... 361/775; 361/772; 361/773; 439/76.2
(58) Field of Classification Search ........ 361/772–775; 174/71–72 B, 70 B, 88 B; 439/76.2, 79, 439/404, 876, 949; 257/690–692
See application file for complete search history.

(56) References Cited

U.S. PATENT DOCUMENTS

| | | | | |
|---|---|---|---|---|
| 4,781,621 | A * | 11/1988 | Sugiyama et al. | 439/559 |
| 5,023,752 | A * | 6/1991 | Detter et al. | 361/752 |
| 5,703,754 | A * | 12/1997 | Hinze | 361/736 |
| 6,166,464 | A * | 12/2000 | Grant | 310/68 R |
| 6,194,656 | B1 * | 2/2001 | Kondo et al. | 174/52.1 |
| 6,224,397 | B1 * | 5/2001 | Nakamura | 439/76.2 |
| 6,238,221 | B1 * | 5/2001 | Ikeda et al. | 439/76.2 |
| 6,270,359 | B1 * | 8/2001 | Kondo et al. | 439/76.2 |
| 6,270,360 | B1 * | 8/2001 | Yanase | 439/76.2 |
| 6,283,769 | B1 * | 9/2001 | Asao et al. | 439/76.2 |
| 6,325,635 | B1 * | 12/2001 | Onizuka | 439/49 |
| 6,397,609 | B1 * | 6/2002 | Shikata et al. | 62/179 |
| 6,409,522 | B1 * | 6/2002 | Onizuka | 439/74 |
| 6,560,115 | B1 * | 5/2003 | Wakabayashi et al. | 361/728 |
| 2001/0026430 | A1 | 10/2001 | Onizuka et al. | |

FOREIGN PATENT DOCUMENTS

JP        A 10-035375        2/1998

(Continued)

*Primary Examiner*—Tuan Dinh
(74) *Attorney, Agent, or Firm*—Oliff & Berridge, PLC

(57) ABSTRACT

A circuit-constituting unit forming a distribution circuit or the like in a vehicle. The circuit-constituting unit includes a plurality of bus bars for constituting a power circuit; a semiconductor switching device provided in the power circuit; and a control circuit board. The bus bars are bonded to a surface of the control circuit board such that the bus bars are arranged to be generally coplanar with each other. The semiconductor switching device is mounted on both of the corresponding bus bars and the control circuit board. An opening may be formed through the control circuit board. In this case, one of terminals of the semiconductor switching device may be connected to a surface of the control circuit board facing away from the surface to which the bus bars are bonded. The other terminals may be connected respectively to the bus bar through the opening.

22 Claims, 13 Drawing Sheets

FOREIGN PATENT DOCUMENTS

| | | | |
|---|---|---|---|
| JP | 410126963 A * 5/1998 | JP | A 2001-268785   9/2001 |

* cited by examiner

CIRCUIT-CONSTITUTING UNIT AND METHOD OF PRODUCING THE SAME

BACKGROUND OF THE INVENTION

1. Field of the Invention

This invention relates to a circuit-constituting unit forming a distribution circuit or the like, and to a method producing the same.

2. Background Art

As conventional means for distributing electric power to electrical loads from a common power source, there is known an electric connection box of the type in which a plurality of bus bar boards are stacked together to form a distribution circuit, and fuses and relay switches are incorporated in this circuit.

In recent years, in order to achieve a compact design and high-speed switching control of such an electric connection box, there has been developed the type of circuit-constituting unit in which instead of using the relays, circuit elements, such as FETs, are provided.

For example, JP-A-10-35375 discloses an electric connection box which comprises a bus bar board, forming a current circuit, FETs (semiconductor switching devices), incorporated in the current circuit, and a control circuit board for controlling the operation of the FETs, and the bus bar board and the control circuit board are arranged at two (upper and lower) stages in spaced relation to each other, and the FETs are disposed between the two boards, and drain terminals and source terminals of the FETs are connected to the bus bar board while gate terminals of the FETs are connected to the control circuit board.

JP-A-2001-268785 discloses a power distributor in which an insulating casing, made of a synthetic resin or the like, is molded around a plurality of bus bars, arranged generally in a common plane, to provide an integral construction, and semiconductor switching devices, such as FETs, are mounted on suitable bus bars to form a power circuit, and a control circuit board is provided in generally parallel, spaced relation to the insulating casing, and this control circuit board is connected to the semiconductor switching devices, and the driving of the semiconductor switching devices is controlled by a control circuit incorporated in the control circuit board.

In the electric connection box, disclosed in JP-A-10-35375, there are needed at least two boards, and besides there must be secured a space for allowing these boards to be arranged in a three-dimensional manner in spaced relation to each so that the FETs can be provided between the two boards. Therefore, as a result of the introduction of the FETs, this electric connection box can be made more compact than the conventional electric connection box of the relay type, but the overall construction thereof is complicated, and can not be made sufficiently compact in size, and particularly there has been encountered a problem that the height thereof must be reduced.

And besides, in the above electric connection box, the FETs are provided between the bus bar board and the control circuit board, and therefore heat, generated from the FETs, is liable to remain in the space between the two boards, and therefore it is necessary to adopt a complicated structure for radiating this heat.

Furthermore, in the above electric connection box, the drain terminal and source terminal of each FET are connected to the lower bus bar board while the gate terminal thereof is connected to the upper control circuit board, and therefore the operation for assembling the electric connection box is complicated, and it is difficult to effect this assembling operation in an automated manner, and it has been desired to improve these situations.

In the power distributor described in JP-A-2001-268785, the bus bars, arranged generally in the common plane, are united by the insulating casing, and therefore it is simpler in construction than the conventional electric connection box, but a thin design thereof is limited. Therefore, the Applicant of the present application has invented a technique of producing a circuit-constituting unit by bonding the bus bars to a surface of a sheet-like insulative base member.

One example thereof is shown in FIG. 20. In this Figure, a number of bus bars, including input terminal bus bars 111 and output terminal bus bars 112, are bonded to one side (lower surface in the illustrated example) of the thin sheet-like insulative base member 120. FET-mounting windows 122 are formed through the insulative base member 120, and each FET 30 is mounted on the corresponding input terminal bus bar 111 and output terminal bus bar 112 through the window 122 from the upper side (in this Figure) in such a manner that the FET straddles a gap between the two bus bars.

The FET 30 includes a body 32 of a generally rectangular parallelepiped shape, and terminals (only a source terminal 34 is shown here), and a drain is exposed at a lower surface of the body 32. The FET body 32 is mounted on the input terminal bus bar 111 in such a manner that the drain is held in contact with the upper surface of this bus bar 111, and the source terminal 34 is mounted on the output terminal bus bar 112.

Such a circuit-constituting unit can form a distribution circuit, including the FETs 30, with a thin structure. More specifically, when the FET 30 is turned on, electric power, inputted to the input terminal bus bar 111, is fed to the output terminal bus bar 112 through the FET 30, and when the FET 30 is turned off, the electrical connection between the bus bars 111 and 112 is interrupted.

In such a circuit-constituting unit of the thin structure, however, the insulative sheet 120 is liable to be flexed at those regions (for example, that portion between the input terminal bus bar 111 and the output terminal bus bar 112 in FIG. 20) where the bus bars are not bonded to this insulative sheet 120 (see dots-and-dash lines in this Figure), and therefore there is a fear that those portions of the FET 30, soldered to the bus bars 111 and 112, are separated therefrom.

SUMMARY OF THE INVENTION

With the above problems in view, it is an object of this invention to provide a circuit-constituting unit in which a power circuit, containing semiconductor switching devices (such as FETs), can be built with a simple and thin structure, and a radiating performance of the semiconductor switching devices is excellent. Another object of the invention is to provide a method of producing this circuit-constituting unit efficiently.

Another object of the invention is to provide a construction in which a circuit-constituting unit, on which circuit elements are mounted, can be formed into a thin design, and besides the mounted condition of the circuit elements is kept good.

The above problems have been solved by a construction which comprises a plurality of bus bars, forming a power circuit, semiconductor switching devices, provided in the power circuit, and a control circuit board for controlling the driving of the semiconductor switching devices, wherein the bus bars are bonded to a surface of the control circuit board in such a manner that the bus bars are arranged generally in a common plane, and each of the semiconductor switching devices is mounted on both of the corresponding bus bars and the control circuit board.

In this construction, the plurality of bus bars, forming the power circuit, are boned to the surface of the control circuit board in such a manner that the bus bars are arranged generally in the common plane, and each of the semiconductor switching devices is mounted on both of the corresponding bus bars and the control circuit board. Therefore, the overall height (thickness) of the circuit-constituting unit is very small, and basically it is not necessary to use a bus bar board (comprising an insulating board holding bus bars) and wiring members (connecting semiconductor switching devices to the boards) as used in the conventional electric connection box (However, in the present invention, such wiring members may be used partially.) Therefore, the overall construction is much thinner and simpler as compared with the conventional electric connection box in which the semiconductor switching devices are connected to the two boards.

More specifically, for mounting the semiconductor switching devices on both of the corresponding bus bars and the control circuit board, for example, through openings are formed through the control circuit board, and part of terminals of the semiconductor switching device is connected to that surface of the control circuit board facing away from the surface thereof to which the bus bars are bonded, and the other terminals of the semi-conductor switching device are connected respectively to the corresponding bus bars through the corresponding through opening. With this simple construction in which the through openings are merely formed respectively through the suitable portions of the control circuit board, the semiconductor switching devices can be mounted on both of the control circuit board and the bus bars, while achieving the thin structure.

In this case, preferably, the semi-conductor switching device has the current-flowing terminal provided on a reverse surface of a body thereof, and the through openings, each having such a size as to allow the body of the semiconductor switching device to be inserted thereinto, are formed through the control circuit board, and the body of the semiconductor switching device is mounted on the corresponding bus bar in such a manner that the current-flowing terminal, provided on the reverse surface of the body of the semiconductor switching device, is held in contact with the bus bar through the through opening. In this construction, since the semiconductor switching device is mounted in such a manner that the current-flowing terminal, provided on the reverse surface of the body of the semiconductor switching device, is held in direct contact with the bus bar, the number of those terminals, projecting from the semiconductor switching device body, is reduced, and therefore the construction is more simplified, and besides the process of mounting the semiconductor switching device is simplified.

In the present invention, the arrangement of the bus bars is not particularly limited to any specified pattern. However, preferably, the plurality of bus bars project from side edges of the control circuit board to form terminals for connection to external circuits, and with this construction the connection between the power circuit, formed by the bus bars, and the external circuits, can be made easily.

Preferably, the bus bars, forming the terminals, are bent to extend in the same direction generally perpendicular to a plane of the control circuit board, and with this construction the overall area, occupied by the circuit-constituting unit, is reduced as a result of bending of the bus bars, and the wiring space is reduced, and besides the wiring connection operation can be effected easily.

Preferably, there are formed housings each of which is made of an insulative material, and is disposed in surrounding relation to the corresponding terminals to provide a connector, and with this construction the terminals can be easily connected to external wiring members, using these connectors.

Each of the housings may be a separate part. However, in the case where there is provided a casing which is made of an insulative material, and contains the bus bars and the control circuit board, at least part of the housings is formed integrally with this casing, and by doing so, the number of the component parts is further reduced.

With respect to this casing, preferably, au upstanding waterproof wall is formed on the casing, and surrounds a region including the semiconductor switching devices, and an opening in the waterproof wall is closed by a cover, and the interior of the closed waterproof wall is sealed by a potting agent. With this construction, the waterproof sealing of the semiconductor switching devices can be positively effected with the simple structure.

Preferably, the power circuit, formed by the bus bars, is a distribution circuit for distributing electric power to a plurality of electrical loads from a common power source. In this case, the terminals include input terminals to be connected to a power source, and a plurality of output terminals to be connected to electrical loads, and the plurality of bus bars form a distribution circuit which feeds, electric power, supplied to the input terminals, from the output terminals to the electrical loads.

The terminals can include signal input terminals to which instruction signals are inputted from the exterior, and in this case the bus bars, forming the signal input terminals, are electrically connected to a control circuit provided at the control circuit board, and with this simple construction, the predetermined instructions can be inputted into the control circuit board.

In the circuit-constituting unit of the present invention, a radiating member is provided at that side of the bus bars facing away from the control circuit board such that the radiating member is interposed between the bus bars and the control circuit board, and the bus bars are connected to the radiating member through an insulating layer. With this construction, the radiating performance of this circuit-constituting unit can be further enhanced.

According to another aspect of the invention, there is provided a method of producing a circuit-constituting unit, comprising a plurality of bus bars, forming a power circuit, semiconductor switching devices, provided in the power circuit, and a control circuit board for controlling the driving of the semiconductor switching devices; wherein this method comprises a bus bar-forming step of forming a bus bar-forming plate, which is made of metal, and is of such a shape that the bus bars are interconnected; a bonding step of bonding the bus bar-forming plate and control circuit board together; a mounting step of mounting the semiconductor switching devices on predetermined ones of the bus bars of the bus bar-forming plate and the control circuit board after the bonding step; and a separating step of separating the bus bars from one another after the bonding step.

In this production method, the bus bar-constituting plate (having such a shape that the bus bars are interconnected) and the control circuit board are bonded together, and therefore the plurality of bus bars can be bonded simultaneously to the control circuit board, while keeping the bus bars in the predetermined arrangement pattern. Thereafter, by separating the bus bars from each other, the proper power circuit can be easily built. And besides, the step of mounting semiconductor switching devices is carried out in the condition in which the bus bars are bonded to the control circuit board, and therefore in the single step, the semiconductor switching devices can be mounted on both of the bus bars and the control circuit board, and the efficiency of the operation is markedly enhanced as compared with the conventional method in which the terminals of the semiconductor switching devices are connected to the bus bar board and the control circuit board, held in spaced relation to each other, in different steps.

The order of the bonding step and the separating step is not limited.

Preferably, the bus bar-forming plate, formed in the bus bar-forming step, has such a shape that bus bar-forming portions are arranged within an outer frame, and at least part of the bus bar-forming portions are connected to the outer frame, and in the bonding step, the control circuit board is bonded at least to that portion of the bus bar-forming plate disposed within the outer frame, and the separating step includes the step of separating the outer frame from the bus bar-forming portions by cutting. In this method, the bus bar-constituting plate includes the outer frame, and therefore has increased rigidity, and therefore the operation for bonding this plate to the control circuit board can be effected easily. And besides, the suitable power circuit can be easily built by separating this outer frame from the bus bar-forming portions after the bonding step.

The bus bar-forming plate, formed in the bus bar-forming step, may have such a shape that it includes connecting portions directly connecting the bus bar-forming portions together. In this case, the connecting portions are disposed outside that portion of the bus bar-forming plate to which the control circuit board is bonded, and with this configuration, the connecting portions can be easily cut off after the bonding of the bus bar-forming plate to the control circuit board.

Preferably, the bonding step includes the step of coating an adhesive onto the control circuit board by printing, and with this method, the bonding of the control circuit board to the bus bar-forming plate can be effected efficiently.

Preferably, in the above mounting step, part of terminals of the semiconductor switching device is connected to that surface of the control circuit board facing away from the surface thereof to which the bus bars are bonded, and the other terminals of the semi-conductor switching device are connected respectively to the corresponding bus bars through a through opening formed through the control circuit board. With this construction, each semiconductor switching device can be mounted on both of the control circuit board and the bus bars at the same time from one direction.

In this case, before the mounting step, a step, which is generally equal to the thickness of the control circuit board, is before hand provided between the terminal of the semiconductor switching device, which is to be connected to the control circuit board, and the terminal thereof which is to be connected to the bus bar. With this construction, the terminals of the semiconductor switching device can be connected respectively to the control circuit boar and the bus bar as they are, that is, without undue deformation, regardless of the thickness of the control circuit board, and stresses in these terminals of the mounted semiconductor switching device are greatly reduced.

Preferably, the method of the invention includes a bending step in which after the bonding step, the plurality of bus bars, projecting from side edges of the control circuit board, are bent to extend in the same direction generally perpendicular to a plane of the control circuit board, thereby forming terminals to be connected to external circuits. By effecting this bending step, external wiring members can be connected to the respective terminals from one direction, and this connecting operation can be simplified.

Further, after the bending step, there is carried out a connector-forming step in which there are formed housings each of which is disposed in surrounding relation to the corresponding terminals to provide a connector. By doing so, the connection to the external wiring members can be effected easily, using the connectors.

Further, there is carried out the step of connecting the bus bars, bonded to the control circuit board, to a radiating member through an insulating layer, and by doing so, there can be obtained the circuit-constituting unit having the more excellent radiating performance.

A circuit-constituting unit according to another aspect of the present invention which is characterized in that a plurality of bus bars, each formed by a flat metal sheet, are bonded to a surface of a flexible, sheet-like insulative base member in such a manner that the plurality of bus bars are arranged generally in a common plane, and a circuit element is mounted on the two specified bus bars in straddling relation to a gap therebetween, thereby forming a power circuit, and the bus bars, bonded to the surface of the insulative base member, include a flexure-suppressing bus bar for suppressing the flexing of the insulative base member between the specified bus bars, and the flexure-suppressing bus bar is provided at a region offset from a region, at which the circuit element is mounted, in a direction perpendicular to a direction of juxtaposing of the specified bus bars, and extends in a direction generally parallel to the juxtaposing direction.

In this construction, the circuit-forming bus bars are bonded to the surface of the insulative base member, and therefore the overall height (thickness) of the circuit-constituting unit is much smaller as compared with the conventional construction, and the very thin design can be achieved. And besides, the flexing of the sheet-like insulative base member between the specified bus bars is suppressed by the rigidity of the flexure-suppressing bus bar which is provided at the region offset from the region, at which the circuit element (semiconductor switching device) is mounted, in the direction perpendicular to the direction of juxtaposing of the specified bus bars, and extends in the direction generally parallel to the juxtaposing direction. Therefore, the separation of the mounted portion of the circuit element from the bus bar due to such flexing or deformation is prevented, and the mounted condition of the circuit element is kept good.

As the circuit element, there can be used any suitable element, such as an FET, a transistor, a diode and a resistor, which is mounted on the surface of the bus bar to form the power circuit.

Although the flexure-suppressing bus bar may be one specially designed for suppressing the flexing of the insulative base member, preferably, at least one of the specified bus bars extends in a direction generally parallel to the direction of juxtaposing of the specified bus bars, and serves also as the flexure-suppressing bus bar. With this construction, the above effect can be achieved with the simple structure, that is, without increasing the number of the bus bars.

Although the insulative base member may be merely in the form of an insulative sheet, preferably, the insulative base member is a circuit control board on which a control circuit for controlling the driving of the circuit element is printed, and the circuit element is mounted on both of the control circuit board and the bus bar. With this construction, there is no need to provide an additional control circuit board, so that the construction is more simplified. Namely, the overall construction is much reduced in thickness, and simplified as compared with the conventional construction in which the control circuit board, separate from the circuit-constituting body, formed by the bus bars, is provided.

DETAILED DESCRIPTION OF THE PREFERRED EMBODIMENTS

The First Preferred Embodiment

A first preferred embodiment of the present invention will now be described with reference to the drawings. Here, although there will be described a method of producing a circuit-constituting unit forming a distribution circuit for distributing electric power, supplied from a common power source mounted on a vehicle or the like, to a plurality of electrical loads, the circuit-constituting unit of the invention is not limited to such use, and can be extensively applied to the case where the on/off switching of the energization in a power circuit is effected by semiconductor switching devices.

1) Bus Bar-Forming Step

Figure 1:
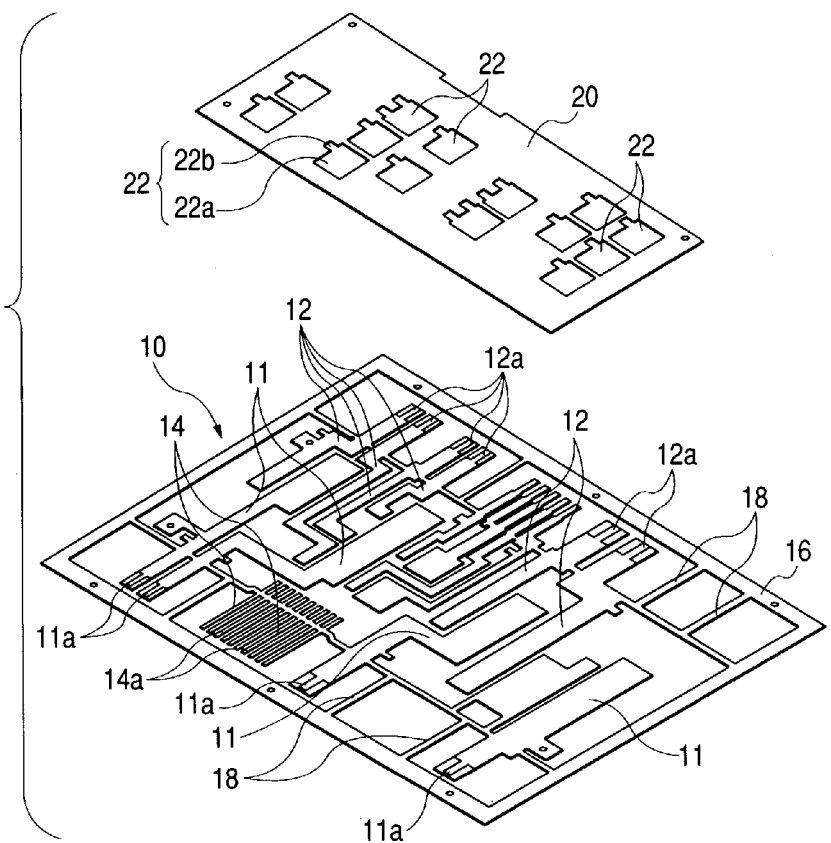
FIG. 1 is a perspective view showing a bus bar-forming plate and a control circuit board which are used in a method of producing a preferred embodiment of a circuit-constituting unit of the present invention.

For producing the above circuit-constituting unit, first, a bus bar-constituting plate 10 as shown in FIG. 1 is formed.

The illustrated bus bar-constituting plate 10 has an outer frame 16 of a rectangular shape, and within this outer frame 16, a number of bus bars, including a plurality of input terminal bus bars 11, forming input terminals, a plurality of output terminal bus bars 12, forming output terminals, and a plurality of signal input terminal bus bars 14, are arranged in a predetermined pattern, and suitable ones of the bus bars are connected to the outer frame 16 by respective connecting portions 18 of a small width, and specified ones of the bus bars are interconnected by respective connecting portions 18 of a small width.

In the illustrated embodiment, end portions 11a of the input terminal bus bars 11 and outer end portions 14a of the signal input terminal bus bars 14 are all arranged at a left side portion of the bus bar-constituting plate 10 while end portions 12a of the output terminal bus bars 12 are all arranged at a right side portion of the bus bar-constituting plate 10. The bus bar end portions 11a, 12a and 14a are not connected to the outer frame 16, and therefore are free.

This bus bar-constituting plate 10 can be easily formed, for example, by blanking a single metal sheet by a pressing operation.

The provision of the outer frame 16 is not always necessary. However, the provision of the outer frame 16 increases the overall rigidity of the bus bar-constituting plate 10, and therefore an operation for bonding this plate to a control circuit board 20 can be carried out more easily, and in addition by gripping the outer frame 16, the bus bar-constituting plate can be easily handled without damaging the bus bar body. And besides, a suitable power circuit can be easily built by separating the outer frame from the bus bar-constituting portion after the bonding operation.

2) Bonding Step

Figure 2:
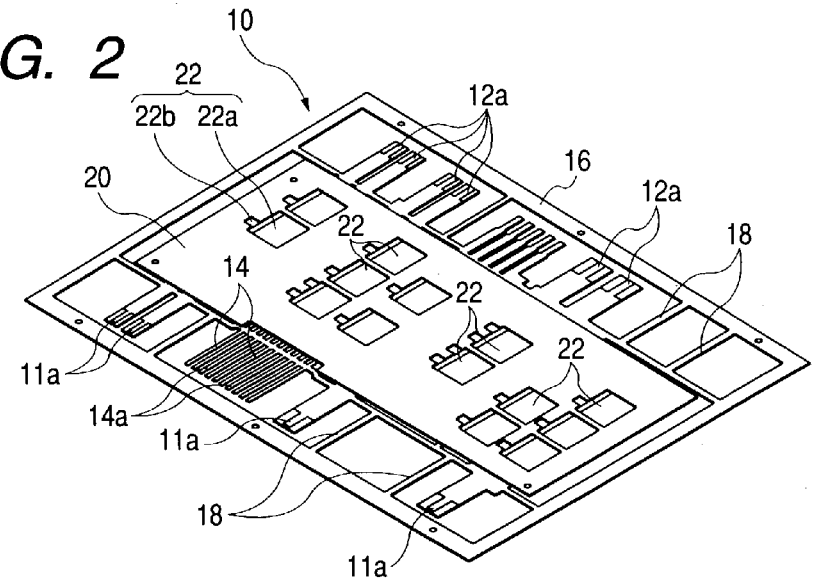
FIG. 2 is a perspective view showing a condition in which the bus bar-forming plate and the control circuit board are bonded together.
Figure 3:
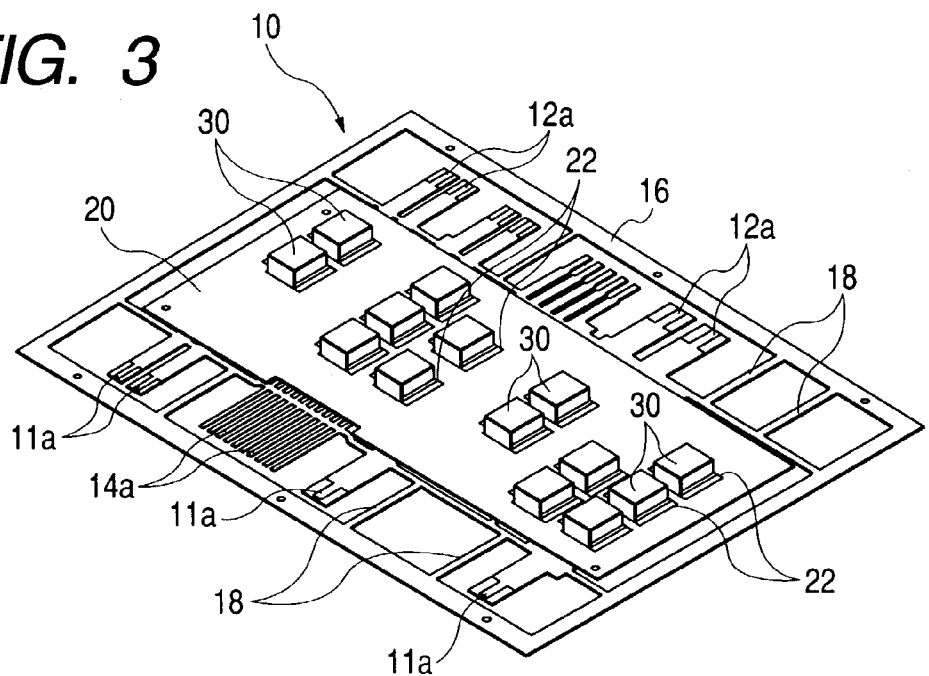
FIG. 3 is a perspective view showing a condition in which FETs are mounted on the bus bar-forming plate and the control circuit board.

The control circuit board 20 is bonded to one side (upper surface in FIG. 1) of the bus bar-constituting plate 10 to provide a structure shown in FIG. 2.

This control circuit board 20 includes a control circuit for controlling the switching operation of FETs (semiconductor switching devices) 30 (described later), and can be formed, for example, by an ordinary printed circuit board (in which conductors, forming the control circuit, are formed on an insulating board by printing). In the illustrated embodiment, the sheet-like control circuit board 20, having a very small thickness (for example, 0.3 mm), is used in order to further enhance the overall thin design and a waterproof effect, and a plurality of through openings 22 are formed through suitable portions of this control circuit board 20, respectively. These through openings 22 are provided for mounting the FETs 30 on the bus bars, and details thereof will be described later.

The outer size of the control circuit board 20 is smaller than the outer size of the bus bar-constituting plate 10, and particularly the width of this board between its right and left side edges is sufficiently smaller than that of the bus bar-constituting plate 10. More specifically, the control circuit board 20 is bonded to a central portion of the bus bar-constituting plate 10 as shown in the drawings, and therefore the end portions 11a of the input terminal bus bars 11 and the end portions 14a of the signal input terminal bus bars 14 project outwardly from the left side edge of the control circuit board 20, while the end portions 12a of the output terminal bus bars 12 project outwardly from the right side edge of the control circuit board 20, and all of the connecting portions 18 are exposed to the exterior of the control circuit board 20 (FIG. 2).

Various methods can be used for bonding the control circuit board 20 to the bus bar-constituting plate 10. Examples of such methods will be described below.

(1) Conductor patterns are formed on both of opposite sides (front and reverse surfaces) of the control circuit board 20, and an adhesive is coated onto the reverse-side (upper side in FIG. 1) pattern or the bus bar-constituting plate 10, and this reverse-side pattern is adhesively bonded to the upper surfaces of the bus bars. In this case, only the pattern, which will be at the same potential as the bus bars, is provided on the reverses side of the control circuit board 20.

(2) An insulative adhesive is coated onto the reverse side of the control circuit board or the upper surface of the bus bar-constituting plate 10, and an insulating layer is formed between the control circuit board 20 and the bus bar-constituting plate 10 by this adhesive. In the case where the control circuit boar 20 includes through holes, care must be taken so that the insulative adhesive will not adhere to these through hole portions (Details will be described later).

(3) An adhesive is coated only onto edge portions of the reverse side of the control circuit board 20, and this control circuit board is bonded to the upper surfaces of the bus bars. In this case, the bonding areas are only these edge portions, and the control circuit board 20 and the bus bars are free relative to each other at those areas within the bonding areas, and therefore stresses are reduced.

In any of the above methods (1), (2) and (3), the adhesive can be coated by printing, and by doing so, the efficiency of the production process, as well as the automation of the production, can be enhanced.

3) Mounting Step

The FETs 30, serving as the semiconductor switching devices, are mounted on both of the control circuit board 20 and the bus bar-constituting plate 10, utilizing the through openings 22 formed in the control circuit board 20.

Figure 4:
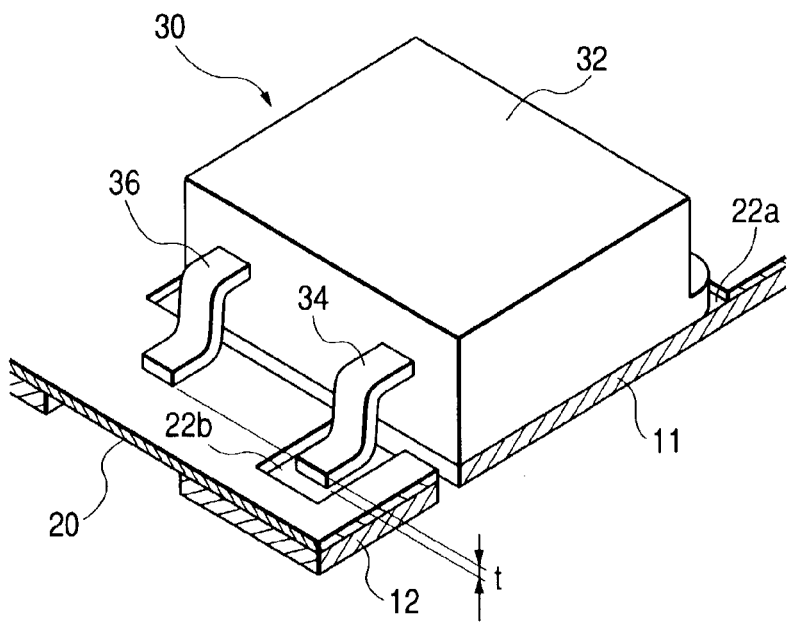
FIG. 4 is a partly-cross-sectional, perspective view showing the FET in its mounted condition on an enlarged scale.

As shown in FIG. 4, each of the FETs 30, used here, includes a body 32 of a generally rectangular parallelepiped shape, and at least three terminals (a drain terminal (not shown), a source terminal 34 and a gate terminal 36). The drain terminal is provided at a reverse side of the body 32, and the source terminal 34 and the gate terminal 36 project from a side surface of the body 32, and extend downwardly.

In accordance with the shape of the FET 30, each of the through openings 22 in the control circuit board 20 includes a rectangular portion 22a for passing the body 32 of the FET 30 therethrough, and an extension portion 22b which extends from the rectangular portion 22a in a predetermined direction, and has such a shape as to allow the source terminal 34 of the FET 30 to pass therethrough. The FET body 32 is mounted on the input terminal bus bar 11 of the bus bar-constituting plate 10 in such a manner that the drain terminal, provided on the reverse side of the FET body 32, is held in direct contact with the upper surface of the bus bar 11 through the rectangular portion 22a, and the source terminal 34 of the FET 30 is connected to the output terminal bus bar 12 through the extension portion 22b, and the gate terminal 36 of the FET 30 is connected to a suitable portion of the conductor pattern on the control circuit board 20.

Namely, in this mounting step, each of the FETs 30 can be mounted on the control circuit board 20 and the bus bars at the same time from the upper side, and the efficiency of the assembling operation is markedly enhanced as compared with the conventional method in which the FETs 30, disposed between the bus bar board and the control circuit board, are connected to the two boards through wiring members in different steps.

This mounting step can be easily carried out, for example, merely by coating molten solder onto the region within each of the through openings 22 by printing or the like and then by putting the FET 30 on the coated solder.

When this mounting step is to be carried out, preferably, a step t (generally equal to the thickness of the control circuit board 20) is beforehand provided between the source terminal 34 and the gate terminal 36 as shown in FIG. 4. With this construction, the two terminals 34 and 36 can be connected respectively to the output terminal bus bar 12 and the control circuit board 20 as they are, that is, without undue deformation, regardless of the thickness of the control circuit board 20, and stresses in these terminals of the mounted FET are greatly reduced.

Figure 5:
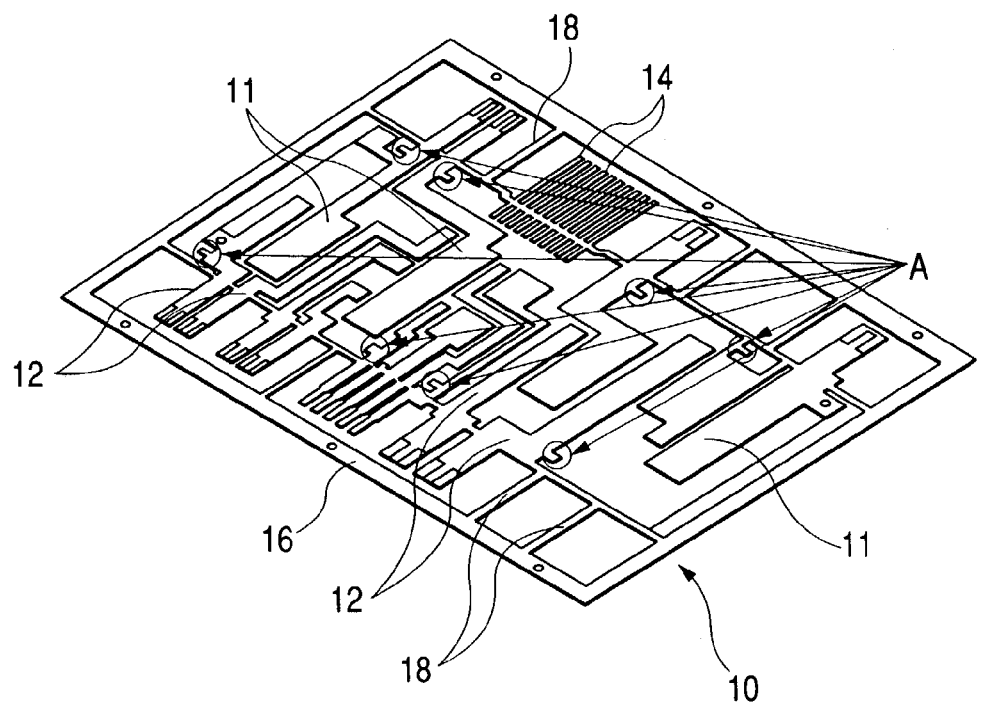
FIG. 5 is a perspective view showing connection portions where the bus bar-forming plate and the control circuit board are directly connected together.

In the case where the bus bars of the bus bar-constituting plate 10 includes those bus bars which are to be directly connected to the control circuits on the control circuit board 20, there may be provided suitable projections (as designated at A in FIG. 5) which project respectively from these bus bars, and are soldered to the control circuit board 20.

4) Bending Step

Figure 6:
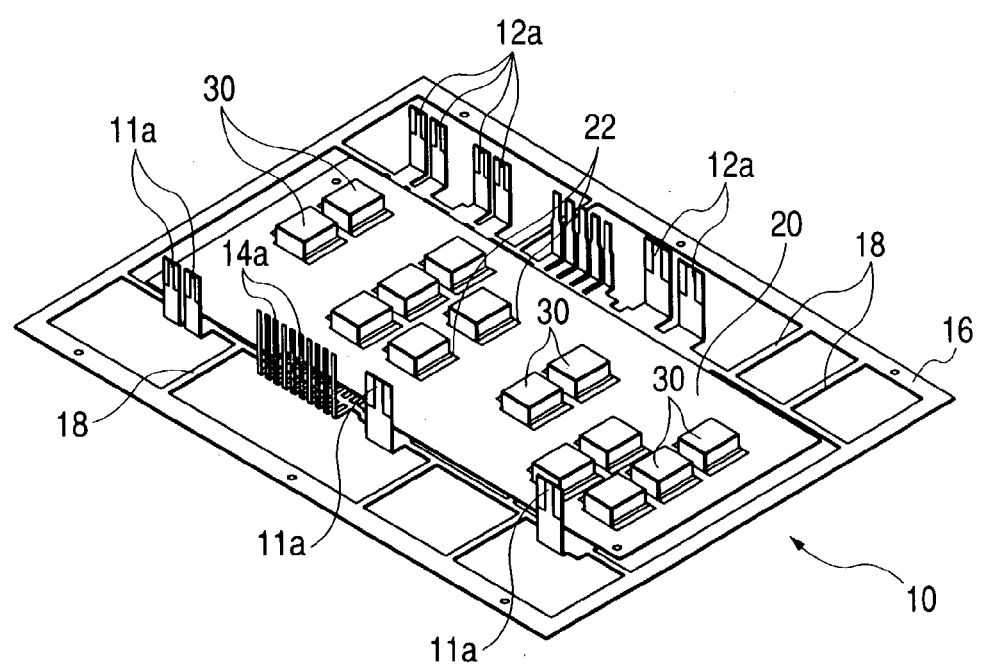
FIG. 6 is a perspective view showing a condition in which end portions of predetermined bus bars of the bus bar-forming plate are bent upwardly.

The bus bar end portions (including at least the end portions 11a, 12a and 14a of the bus bars 11, 12 and 14 in the drawings), projecting from the opposite (right and left) side edges of the control circuit board 20, are bent to extend upwardly, thereby forming terminals to be connected to external circuits as shown in FIG. 6. By effecting this bending step, external wiring members can be connected to these terminals from one direction, and this connecting operation can be simplified.

5) Housing-Mounting Step (Connector-Forming Step 1)

Figure 7:
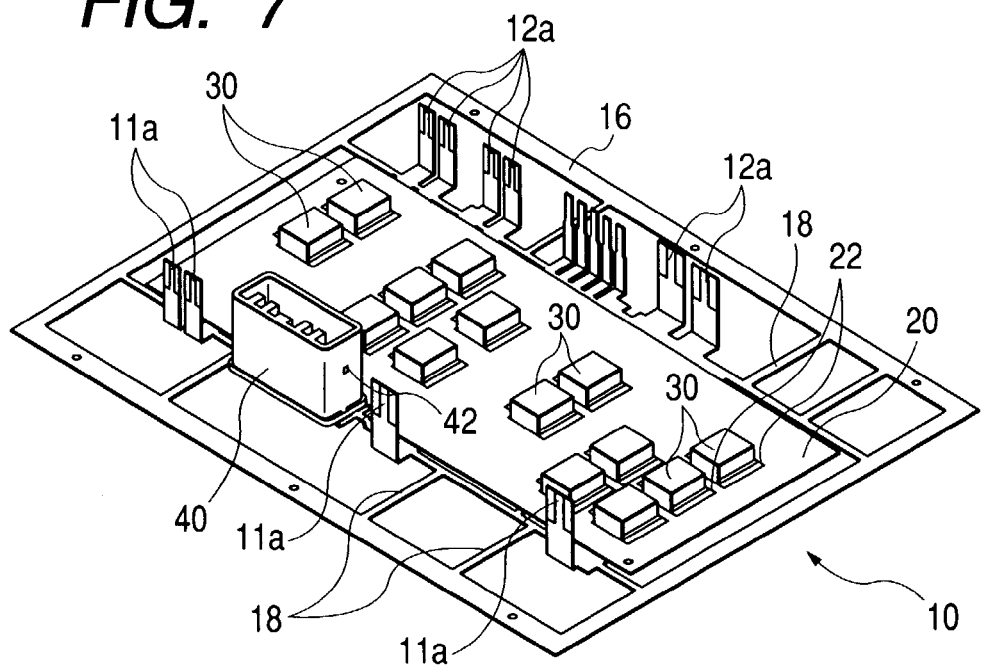
FIG. 7 is a perspective view showing a condition in which a housing is provided in surrounding relation to the end portions of the bent signal input terminal bus bars to form a connector.

As shown in FIG. 7, a housing 40, made of an insulative material such as a synthetic resin, is fixed around the plurality of signal input terminals (which are the end portions 14a of the signal input terminal bus bars 14, and are arranged in a row) to form a connector. Projections 42 for engagement with a casing 50 (described later) are formed on a side surface of this housing 40.

6) Separating Step

The bus bars of the bus bar-constituting plate 10 are separated from one another by pressing or the like, thereby completing the power circuit. More specifically, this can be effected by cutting and removing the connecting portions 18 exposed to the exterior of the control circuit board 20. As a result of removal of these connecting portions 18, the outer frame 16 is also naturally removed from the circuit-constituting unit. In the condition after this separating step, the overall height (thickness) is very small, and the occupying area of the circuit-constituting unit is generally equal to the area of the control circuit board 20. Although this circuit-constituting unit can be used alone, its waterproof performance and radiating performance can be enhanced by the addition of the casing 50 and a radiating member 60 (described later), and therefore there can be obtained the circuit unit suited for an on-vehicle power distributor or the like.

Incidentally, this separating step may be effected before the above steps 3) to 5). However, in the case where the bus bar end portions 11a, 12a and 14a, forming the terminals, are connected to the outer frame 16 and other bus bars, the separating step need to be effected before these steps.

7) Casing-Mounting Step (Connector-Forming Step 2)

Figure 9:
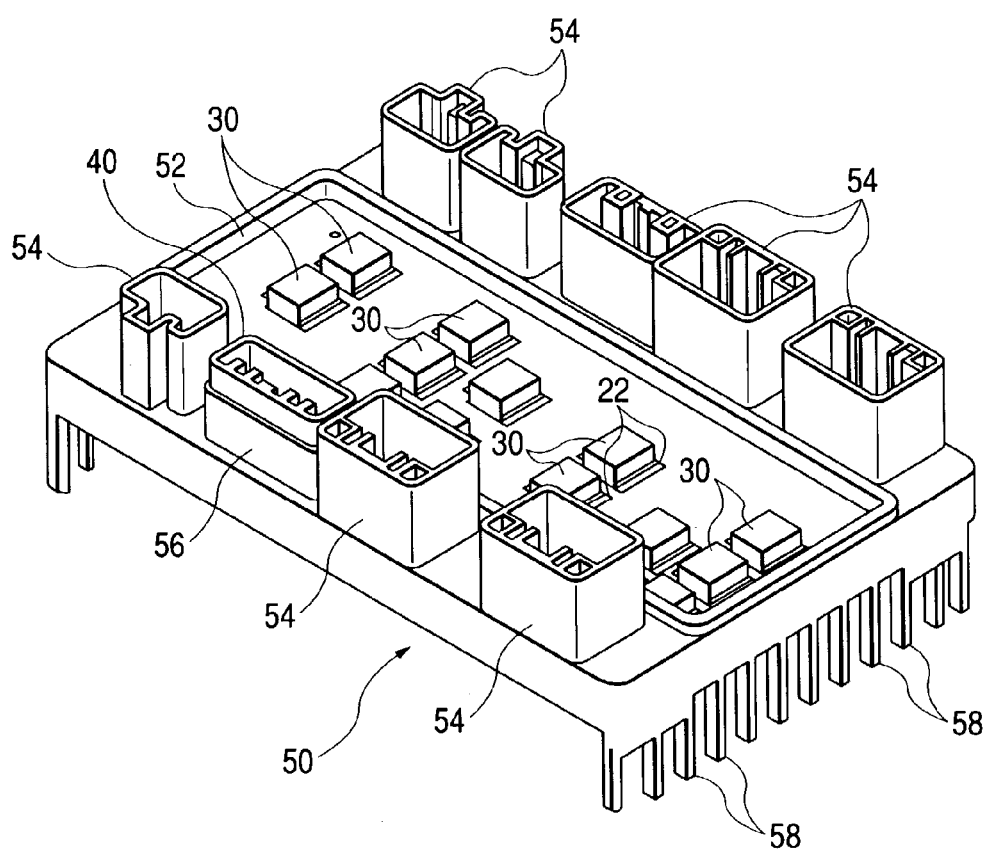
FIG. 9 is a perspective view showing a condition in which a casing is mounted on the control circuit board and the bus bars.

The casing 50 (FIG. 9), made of the insulative material such as a synthetic resin, is fitted on the circuit-constituting unit, obtained at the separating step 6), from the upper side. This casing 50 is open at its lower side, and has such a shape that it can cover the whole of the control circuit board 20 from the upper side. An opening, through which the FETs 30 are exposed upwardly, is formed in a central portion of this casing, and an upwardly-directed waterproof wall 52 is formed at a peripheral edge of this opening in an upstanding manner. Namely, this waterproof wall 52 surrounds the region including the FETs 30.

Tubular housings 54 and a tubular housing-mounting portion 56 are formed integrally with the casing 50, and are disposed at right and left side portions of the casing 50 (that is, on opposite (right and left) sides of the waterproof wall 52), each of these housings 54 and 56 being open at its upper and lower sides. The housings 54 are formed at a plurality of portions of this casing, respectively, and surround the groups of end portions 11a (input terminals) of the input terminal bus bars 11 and the group of end portions 12a (output terminals) of the output terminal bus bars 12, respectively, and each housing 54 forms, together with the associated terminals, a connector. The housing-mounting portion 56 is formed at a position corresponding to the housing 40 (surrounding the signal input terminals), and the housing 40 is inserted into this housing-mounting portion 56 from the lower side thereof, and the projections 42, formed on the side wall of the housing 40, are engaged with the upper end of the housing-mounting portion 56, so that the bus bars and the control circuit board 20 are retained relative to the casing 50.

In this structure, connectors, provided, for example, at ends of wire harnesses installed on a vehicle, are connected respectively to the connectors formed respectively by the housings 40 and 54 and their associated terminals, and by doing so, these terminals can be easily connected to the external circuits.

A plurality of fin cover portions 58, juxtaposed in a right-left direction, project downwardly from each of opposite (front and rear) ends of the casing 50.

8) Radiating Member-Connecting Step

Figure 10:
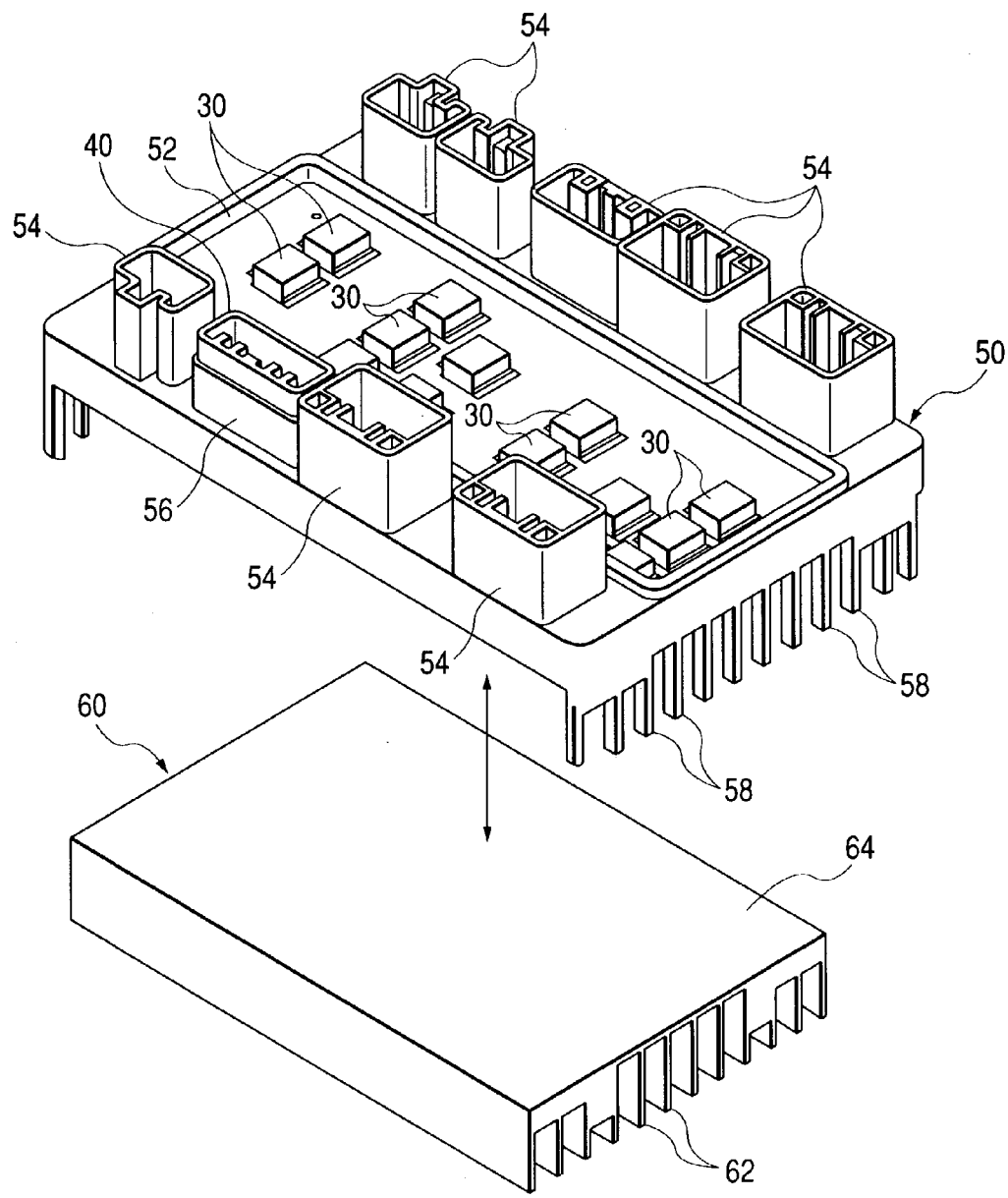
FIG. 10 is a perspective view showing the circuit-constituting unit, having the casing mounted thereon, and a radiating member to be attached thereto.

An upper surface 64 of the radiating member 60, shown in FIG. 10, is bonded to the lower surfaces of the bus bars, so that the bus bars are joined to this radiating member.

The radiating member 60 is made of a material of good thermal conductivity, such as aluminum-base metal, and has the flat upper surface 64, and a plurality of fins 62, juxtaposed in a right-left direction, project downwardly from a lower surface of this radiating member. The positions of the fins 62 correspond to the positions of the fin cover portions 58, and therefore when the radiating member 60 is attached, opposite ends of the fins 62 are covered with the fin cover portions 58.

Preferably, the bonding of the radiating member 60 to the bus bars is effected, for example, in the following manner.

(1) An insulative adhesive, made of an epoxy resin, is coated onto the upper surface 64 of the radiating member 60, and is dried to form a thin insulating layer.

(2) An adhesive (for example, a grease-like silicone adhesive), which is softer and is higher in thermal conductivity than the material forming the above insulating layer, is coated onto this insulating layer, or this adhesive is coated onto the bus bars, and the bus bars are bonded by this adhesive.

Here, the insulating layer in the above step (1) does not always need to be provided. However, by forming this insulating layer, the reliable electrical insulation can be secured while keeping the amount of the expensive adhesive (soft and excellent in thermal conductivity), used in the above step (2), to a minimum. The insulating layer in the above step (1) can be formed, for example, by affixing an insulating sheet to the upper surface 64 of the radiating member 60.

In the case where the bus bars include those bus bars which are to be connected to a ground potential, the radiating member 60 may be fixedly secured to such bus bars by screws, in which case the radiating member 60 is connected to the ground.

In addition to the bonding of the bus bars to the radiating member 60, preferably, engagement portions for engagement with each other are provided at the casing 50 and the radiating member 60, so that the radiating member 60 is fixed also to the casing by these engagement portions. Further, by interposing a sealing member, made of a silicone rubber or the like, between the casing 50 and the radiating member 60, the waterproof performance of the circuit-constituting unit can be further enhanced.

9) Potting Step

Figure 11:
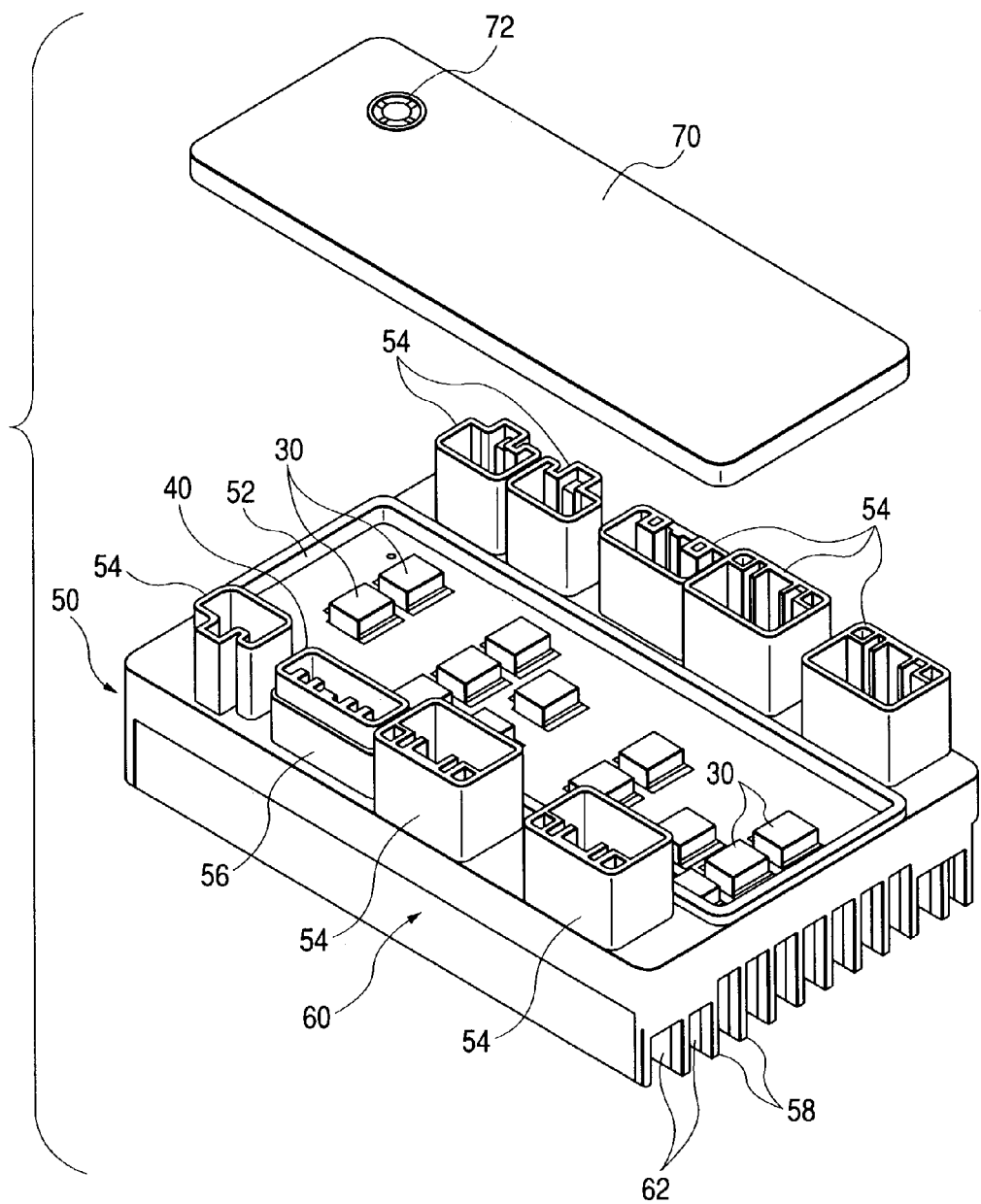
FIG. 11 is a perspective view showing the circuit-constituting unit, having the radiating member attached thereto, and a cover to be attached to a waterproof wall on the casing.
Figure 12:
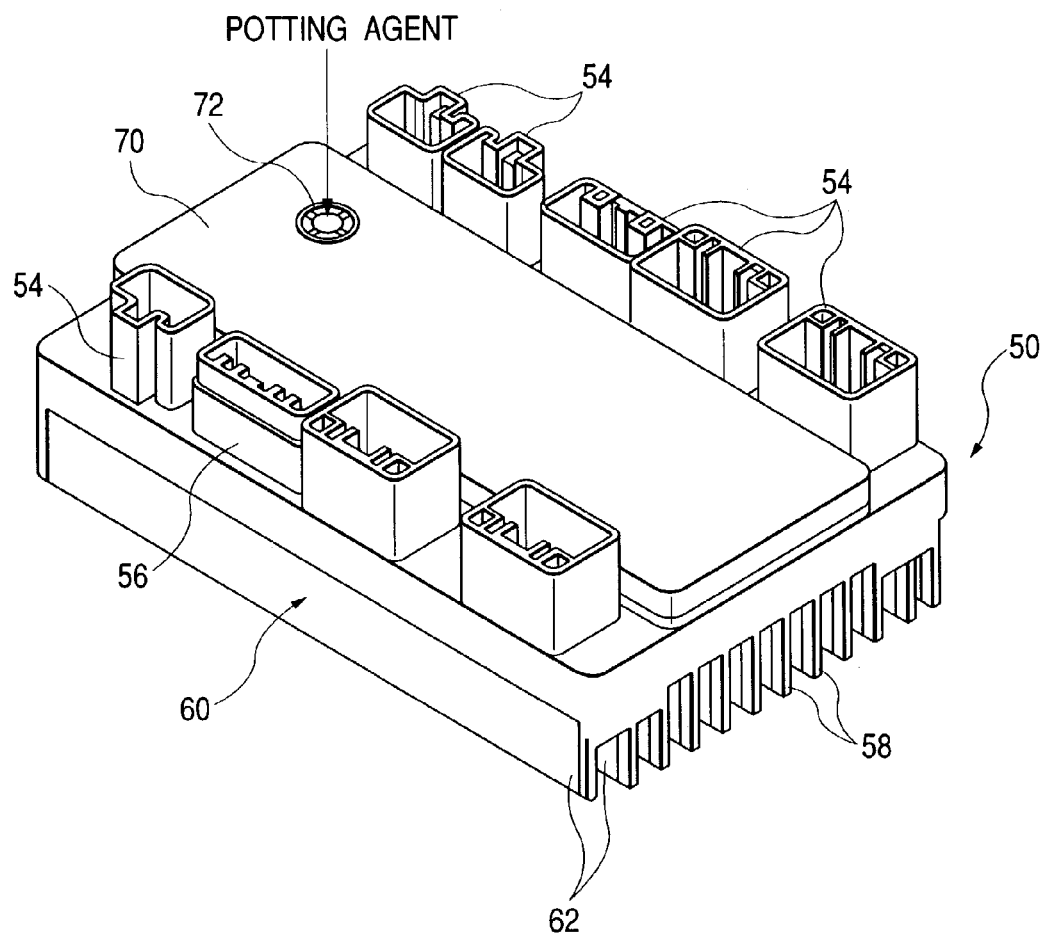
FIG. 12 is a perspective view showing the process of pouring a potting agent through a potting agent-pouring port formed in the attached cover.

A cover 70, shown in FIG. 11, is fitted on the upper edge of the waterproof wall 52, and the two are joined together (for example, by vibration welding), thereby sealing the interior of the waterproof wall 52. Further, a suitable potting agent is poured through a potting agent-pouring port 72, formed in the cover 70, as shown in FIG. 12, thereby sealing the interior of the waterproof wall 52. As a result, the waterproof effect of the circuit-constituting unit is further enhanced.

In the thus produced circuit-constituting unit, the power source is connected to the input terminals (the end portions 11a of the input terminal bus bars 11), and the electrical loads are connected to the output terminals (the end portions 12a of the output terminal bus bars 12), and by doing so, there is built the distribution circuit for distributing electric power from the power source to the suitable electrical loads, and the operation of the FETs 30, provided in the distribution circuit, is controlled by the control circuit incorporated in the control circuit board 20, so that the on/off control for the energization of the distribution circuit is effected.

Figure 13:
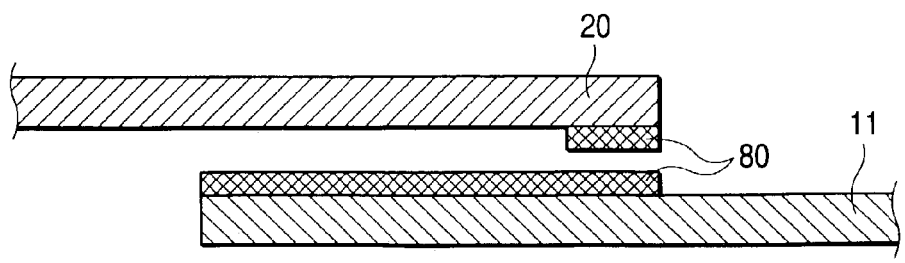
FIG. 13 is a cross-sectional view showing an example of adhesive-coating region in the bonding step.

For coating the insulative adhesive onto the reverse surface of the control circuit board and the upper surface of the bus bar-constituting plate in the above bonding step, the insulating adhesive may be coated onto only one of the two surfaces, but preferably, the insulative adhesive is coated onto that portion of the upper surface of the bus bar (Although only the input terminal bus bar 11 is shown in FIG. 13, this is the same with the other bus bars. The same showing is applied in the following.), overlapping the control circuit board 20, and also onto each of the corresponding side edge portion of the lower surface of the control circuit board 20, as shown in FIG. 13, and by doing so, the more positive bonding can be achieved.

Figure 14A:
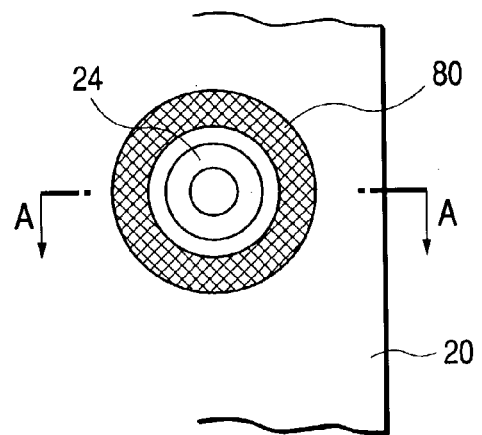
FIG. 14A is a bottom view showing an example of an adhesive-coating region in the bonding step in the case where through hole connection portions exist in the control circuit board.
Figure 14B:
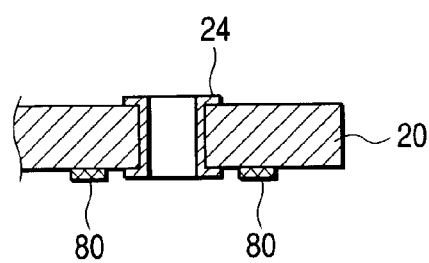
FIG. 14B is a cross-sectional view taken along the line A—A of FIG. 14A.

In the case where the control circuit board 20 has through hole connection portions 24 as shown in FIG. 14, an adhesive 80 is applied to the control circuit board in such a manner that this adhesive is not coated onto these through hole connection portions 24, and by doing so, the bonding between the control circuit board 20 and the bus bar 11 can be effected while securing the reliability of the electrical connection.

Figure 15A:
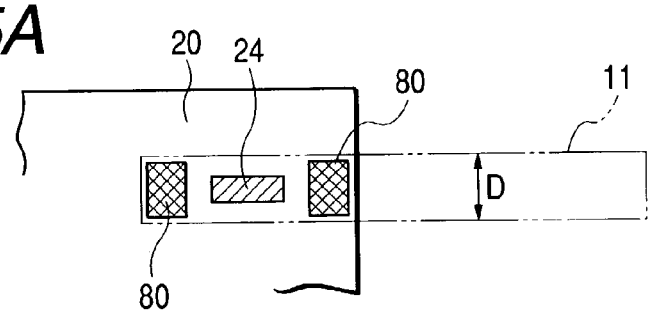
FIGS. 15A and 15B are bottom views respectively showing examples in which an adhesive is coated in such a manner that the adhesive is not applied to a through hole connection portion.
Figure 15B:
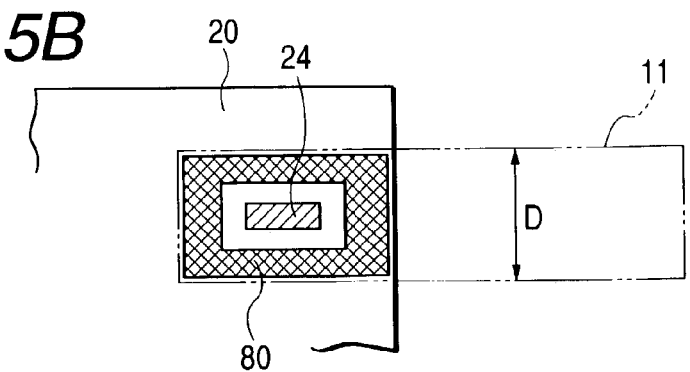

This is the same with the case where the bus bar 11 is electrically connected by soldering to the control circuit board 20, using the through hole connection portion 24. For example, in the case where the difference between the width of the through hole connection portion 24 and the width D of the bus bar 11 is small (The bus bar width D is relatively small) as shown in FIG. 15A, the adhesive 80 need to be applied only to those portions of the control circuit board 20 disposed respectively on front and rear sides of the through hole connection portion 24, and in the case where the bus bar width D is sufficiently large as shown in FIG. 15B, the adhesive 80 is applied in surrounding relation to the through hole connection portion 24.

Figure 16:
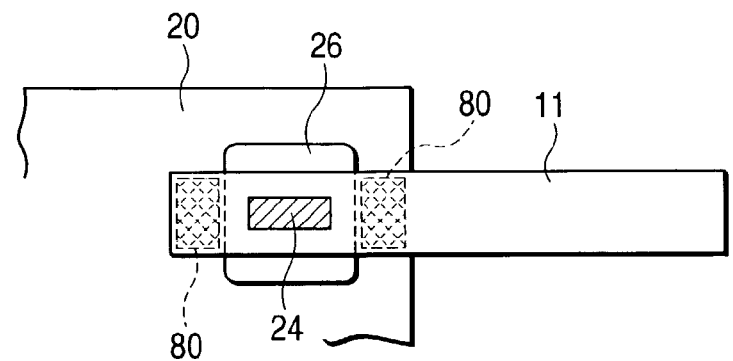
FIG. 16 is a bottom view showing an example in which an adhesive is coated in such a manner that the adhesive is not applied to soldered portions.

In the case where the opposite side edges of the bus bar 11 are electrically connected to the lower surface of the control circuit board 20 by solder 26 as shown in FIG. 16, preferably, the adhesive 80 is applied in such a manner that this adhesive 80 is not coated onto the region of the solder 26.

The present invention is not limited to the circuit-constituting unit produced by the above method, but can be applied to any other suitable construction in which bus bars are bonded to the surface of the control circuit board, and in this condition the semi-conductor switching devices are mounted on the bus bars, and with this construction, there are achieved an advantageous effect that the overall construction has the simple and thin design.

The semiconductor switching devices, used in the present invention, are not limited to the above-mentioned FETs, but various types can be used in so far as they includes current-flowing terminals, connected to the power circuit formed by the bus bars, and a control terminal connected to the control circuit board 20.

As described above, in the present invention, the plurality of bus bars, forming the power circuit, are bonded to the surface of the control circuit board, and each of the semi-conductor switching devices is mounted on both of the corresponding bus bars and the control circuit board. Therefore, advantageously, there can be provided the circuit-constituting unit in which the power circuit, containing the semiconductor switching devices, can be built with the simple and thin structure, and the radiating performance of the semiconductor switching devices is excellent.

In the production of this circuit-constituting unit, the bus bar-constituting metal plate (having such a shape that the bus bars are interconnected) and the control circuit board are bonded together, and thereafter the mounting of the semiconductor switching devices and the separation of the bus bars from each other are effected, and with this method this circuit-constituting unit can be produced efficiently.

The Second Preferred Embodiment

A second preferred embodiment of the present invention will now be described with reference to the drawings. Here, although there will be described a method of producing a circuit-constituting unit forming a power distributor having a distribution circuit for distributing electric power, supplied from a common power source mounted on a vehicle or the like, to a plurality of electrical loads, the circuit-constituting unit of the invention is not limited to such use, and can be extensively applied to the case where the on/off switching of the energization in a power circuit is effected by semiconductor switching devices. Further, the present invention is not limited to the following production method.

1) Bus Bar-Forming Step

Figure 17:
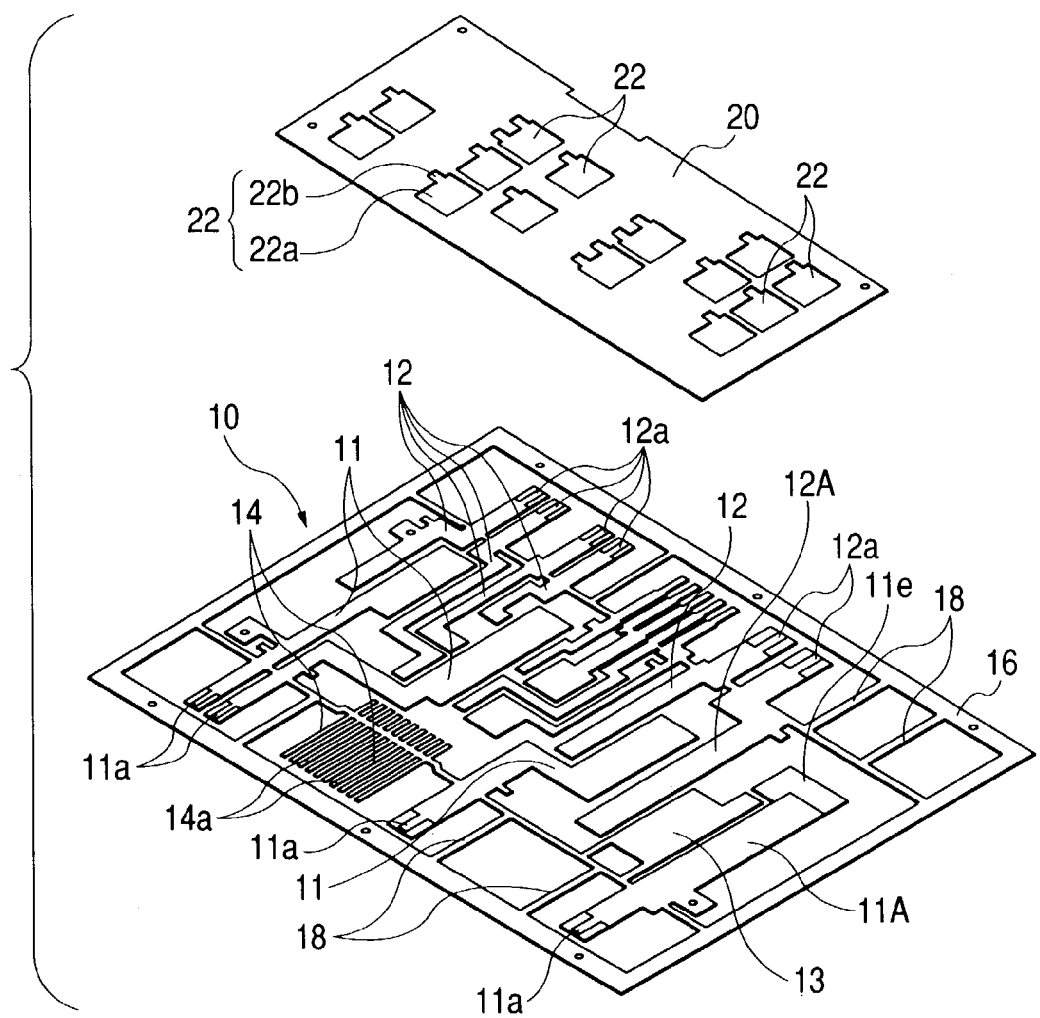
FIG. 17 is a perspective view showing a bus bar-forming plate and a control circuit board which are used in a method of producing a preferred embodiment of a circuit-constituting unit of another aspect of the present invention.
Figure 18A:
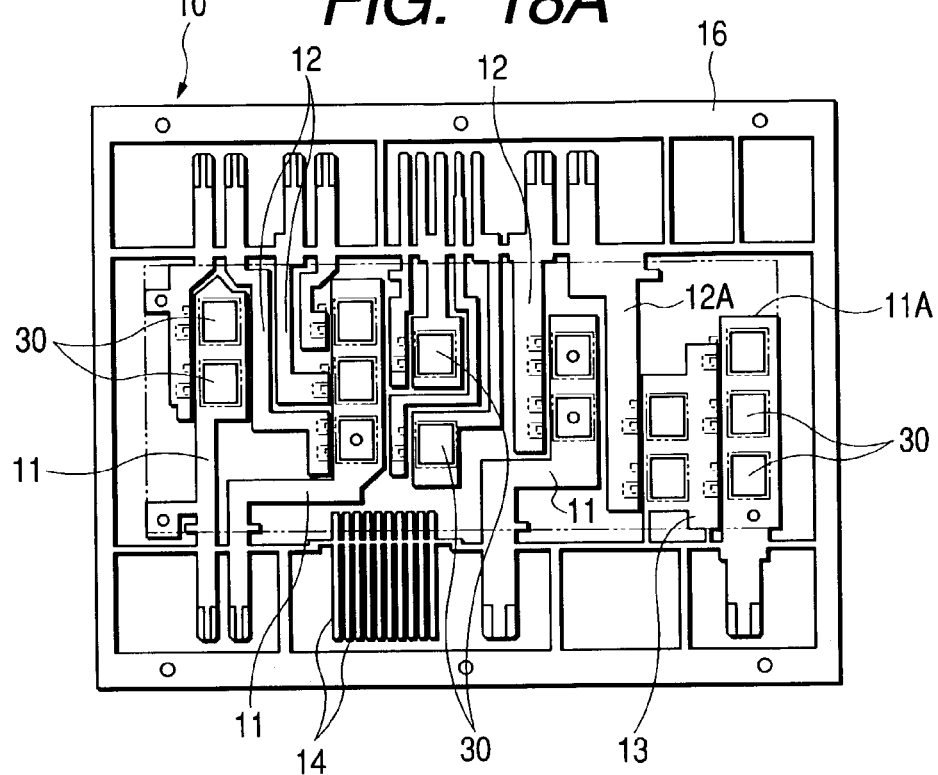
FIG. 18A is a plan view showing the bus bar-forming plate which is not provided with flexure-suppressing means of the invention.
Figure 18B:
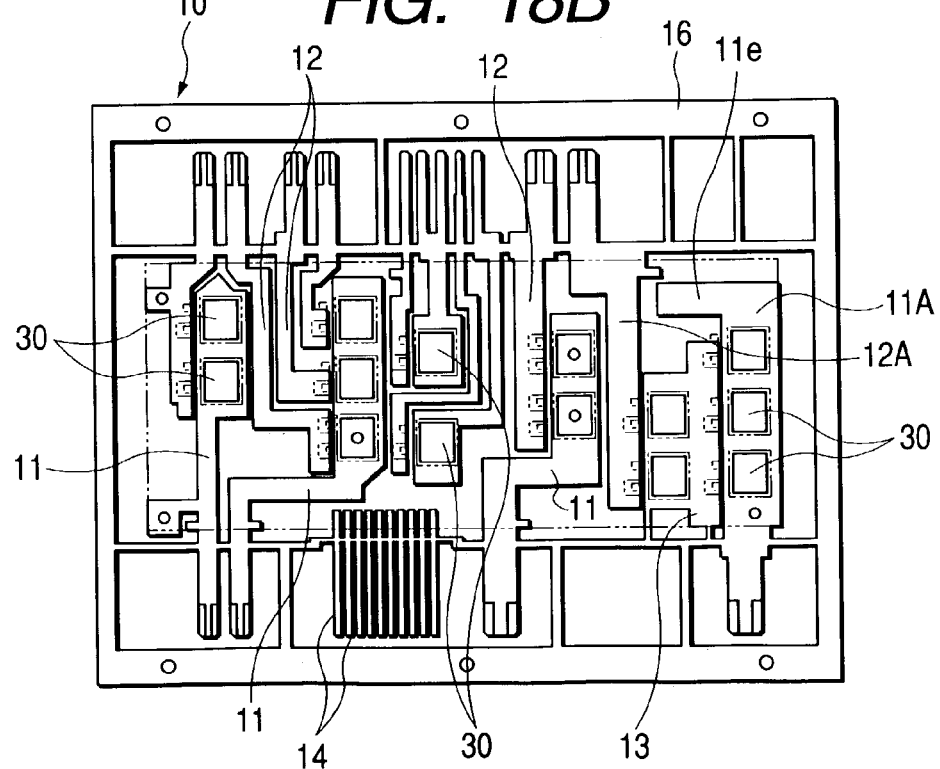
FIG. 18B is a plan view showing the bus bar-forming plate which is provided with the flexure-suppressing means of the invention.
Figure 19A:
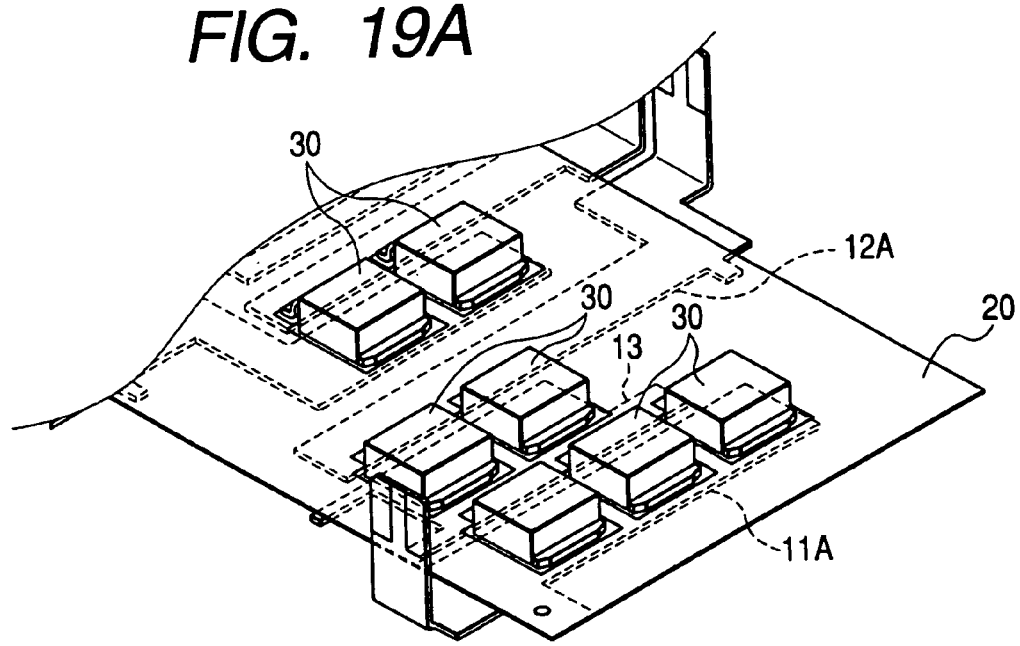
FIG. 19A is a perspective view showing the circuit-constituting unit which is not provided with the flexure-suppressing means of the invention.
Figure 19B:
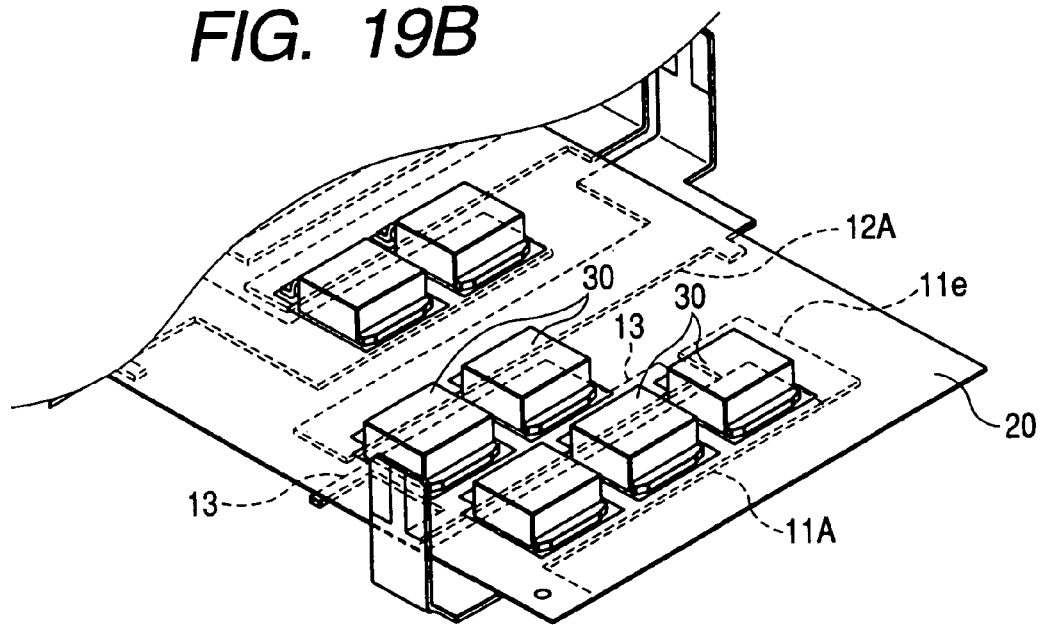
FIG. 19B is a perspective view showing the circuit-constituting unit which is provided with the flexure-suppressing means of the invention.
Figure 20:
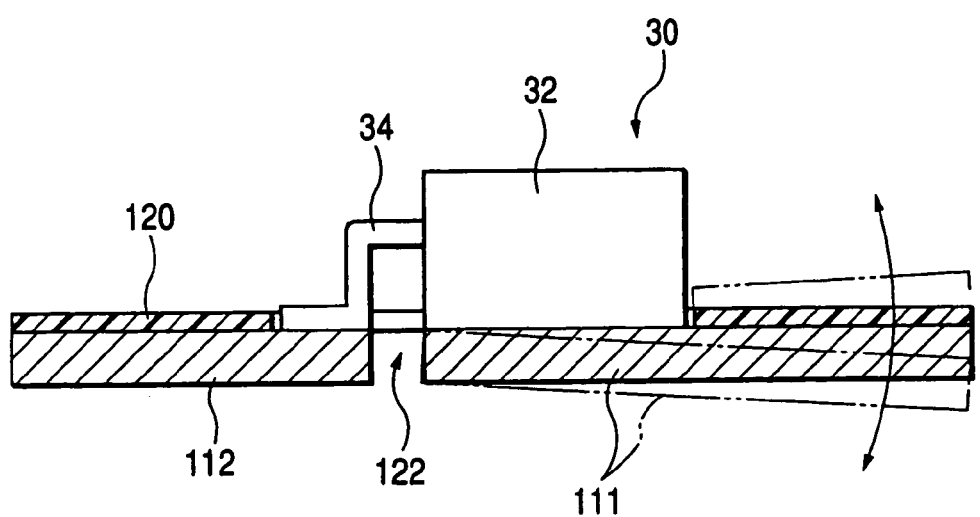
FIG. 20 is a cross-sectional view of a circuit-constituting unit, showing a flexed condition thereof in which bus bars are mounted on a surface of a thin sheet-like insulative base member, and an FET is mounted on surfaces of these bus bars.

For producing the above circuit-constituting unit, first, a bus bar-constituting plate 10 as shown in FIG. 17 is formed.

The illustrated bus bar-constituting plate 10 has an outer frame 16 of a rectangular shape, and within this outer frame 16, a number of bus bars, including a plurality of input terminal bus bars 11, forming input terminals, a plurality of output terminal bus bars 12, forming output terminals, and a plurality of signal input terminal bus bars 14, are arranged in a predetermined pattern, and suitable ones of the bus bars are connected to the outer frame 16 by respective connecting portions 18 of a small width, and specified ones of the bus bars are interconnected by respective connecting portions 18 of a small width.

In the illustrated embodiment, end portions 11a of the input terminal bus bars 11 and outer end portions 14a of the signal input terminal bus bars 14 are all arranged at a left side portion of the bus bar-constituting plate 10 while end portions 12a of the output terminal bus bars 12 are all arranged at a right side portion of the bus bar-constituting plate 10. The bus bar end portions 11a, 12a and 14a are not connected to the outer frame 16, and therefore are free.

As shown in FIGS. 17, 18A, 18B, 19A, and 19B, a relay bus bar 13 is interposed between the specified input terminal bus bar 11A and output terminal bus bar 12A.

This bus bar-constituting plate 10 can be easily formed, for example, by blanking a single metal sheet by a pressing operation. In the present invention, however, individual bus bars may be bonded to an insulative base member.

2) Bonding Step

A control circuit board 20 is bonded to one side (upper surface in FIG. 17) of the bus bar-constituting plate 10 to provide a structure shown in FIG. 2.

This control circuit board 20 includes a control circuit for controlling the switching operation of FETs (circuit elements) 30 (described later), and preferably this control circuit board is formed, for example, into a flexible, thin sheet-like structure similar to that of an ordinary printed circuit board (in which conductors, forming the control circuit, are formed on an insulating board by printing). In the illustrated embodiment, the sheet-like control circuit board 20, having a very small thickness (for example, 0.3 mm), is used, and a plurality of through openings 22 are formed through suitable portions of this control circuit board 20, respectively. These through openings 22 are provided for mounting the FETs 30 on the bus bars, and details thereof will be described later.

The outer size of the control circuit board 20 is smaller than the outer size of the bus bar-constituting plate 10, and particularly the width of this board between its right and left side edges is sufficiently smaller than that of the bus bar-constituting plate 10. More specifically, the control circuit board 20 is bonded to a central portion of the bus bar-constituting plate 10 as shown in the drawings, and therefore the end portions 11a of the input terminal bus bars 11 and the end portions 14a of the signal input terminal bus bars 14 project outwardly from the left side edge of the control circuit board 20, while the end portions 12a of the output terminal bus bars 12 project outwardly from the right side edge of the control circuit board 20, and all of the connecting portions 18 are exposed to the exterior of the control circuit board 20 (FIG. 2).

3) Mounting Step

The circuit elements (the FETs 30 in the illustrated embodiment) are mounted on both of the control circuit board 20 and the bus bar-constituting plate 10, utilizing the through openings 22 formed in the control circuit board 20.

As shown in FIG. 4, each of the FETs 30, used here, includes a body 32 of a generally rectangular parallelepiped shape, and at least three terminals (a drain terminal (not shown), a source terminal 34 and a gate terminal 36). The drain terminal is provided at a reverse side of the body 32, and the source terminal 34 and the gate terminal 36 project from a side surface of the body 32, and extend downwardly.

In accordance with the shape of the FET 30, each of the through openings 22 in the control circuit board 20 includes a rectangular portion 22a for passing the body 32 of the FET 30 therethrough, and an extension portion 22b which extends from the rectangular portion 22a in a predetermined direction, and has such a shape as to allow the source terminal 34 of the FET 30 to pass therethrough. The FET body 32 is mounted on the input terminal bus bar 11 of the bus bar-constituting plate 10 in such a manner that the drain terminal, provided on the reverse side of the FET body 32, is held in direct contact with the upper surface of the bus bar 11 through the rectangular portion 22a, and the source terminal 34 of the FET 30 is connected to the output terminal bus bar 12 through the extension portion 22b, and the gate terminal 36 of the FET 30 is connected to a suitable portion of the conductor pattern on the control circuit board 20. In this step, the FET 30 is mounted on the corresponding input terminal bus bars 11 and output terminal bus bar 12 in straddling relation to a gap therebetween, and there is built the distribution circuit in which electric power is fed from the input terminal bus bar 11 to the output terminal bus bar 12 via the FET 30 (serving as switching means).

With respect to the relay bus bar 13 (shown in FIGS. 17, 18A, 18B, 19A and 19B), interposed between the specified input terminal bus bar 11A and output terminal bus bar 12A, the corresponding FETs 30 are mounted on the input terminal bus bar 11A and the relay bus bar 13 in straddling relation to a gap therebetween, and the corresponding FETs 30 are mounted on the relay bus bar 13 and the output terminal bus bar 12A in straddling relation to a gap therebetween. Therefore, electric power, inputted to the input terminal bus bar 11A, is fed to the output terminal bus bar 12A sequentially via the FET 30, the relay bus bar 13 and the FET 30.

This mounting step can be easily carried out, for example, merely by coating molten solder onto the region within each of the through openings 22 for printing or the like and then by putting the FET 30 on the coated solder.

When this mounting step is to be carried out, preferably, a step t (generally equal to the thickness of the control circuit board 20) is beforehand provided between the source terminal 34 and the gate terminal 36 as shown in FIG. 4. In the case where the bus bars of the bus bar-constituting plate 10 includes those bus bars which are to be directly connected to the control circuits on the control circuit board 20, there may be provided suitable projections (as designated at A in FIG. 5) which project respectively from these bus bars, and are soldered to the control circuit board 20.

4) Bending Step

The bus bar end portions (including at least the end portions 11a, 12a and 14a of the bus bars 11, 12 and 14 in the drawings), projecting from the opposite (right and left) side edges of the control circuit board 20, are bent to extend upwardly, thereby forming terminals to be connected to external circuits as shown in FIG. 6.

5) Housing-Mounting Step

As shown in FIG. 7, a housing 40, made of an insulative material such as a synthetic resin, is fixed around the plurality of signal input terminals (which are the end portions 14a of the signal input terminal bus bars 14, and are arranged in a row) to form a connector. Projections 42 for engagement with a casing 50 (described later) are formed on a side surface of this housing 40.

6) Separating Step

The bus bars of the bus bar-constituting plate 10 are separated from one another by pressing or the like, thereby completing the power circuit. More specifically, this can be effected by cutting and removing the connecting portions 18 exposed to the exterior of the control circuit board 20. As a result of removal of these connecting portions 18, the outer frame 16 is also naturally removed from the circuit-constituting unit. In the condition after this separating step, the overall height (thickness) is very small, and the occupying area of the circuit-constituting unit is generally equal to the area of the control circuit board 20. Although this circuit-constituting unit can be used alone, its waterproof performance and radiating performance can be enhanced by the addition of the casing 50 and a radiating member 60 (described later), and therefore there can be obtained the circuit unit suited for an on-vehicle power distributor or the like.

7) Casing-Mounting Step

The casing 50 (FIG. 9), made of the insulative material such as a synthetic resin, is fitted on the circuit-constituting unit, obtained at the separating step 6), from the upper side. This casing 50 is open at its lower side, and has such a shape that it can cover the whole of the control circuit board 20 from the upper side. An opening, through which the FETs 30 are exposed upwardly, is formed in a central portion of this casing, and an upwardly-directed cover-mounting wall 52 is formed at a peripheral edge of this opening in an upstanding manner. Namely, this cover-mounting wall 52 surrounds the region including the FETs 30.

Tubular housings 54 and a tubular housing-mounting portion 56 are formed integrally with the casing 50, and are disposed at right and left side portions of the casing 50 (that is, on opposite (right and left) sides of the cover-mounting wall 52), each of these housings 54 and 56 being open at its upper and lower sides. The housings 54 are formed at a plurality of portions of this casing, respectively, and surround the groups of end portions 11a (input terminals) of the input terminal bus bars 11 and the group of end portions 12a (output terminals) of the output terminal bus bars 12, respectively, and each housing 54 forms, together with the associated terminals, a connector. The housing-mounting portion 56 is formed at a position corresponding to the housing 40 (surrounding the signal input terminals), and the housing 40 is inserted into this housing-mounting portion 56 from the lower side thereof, and the projections 42, formed on the side wall of the housing 40, are engaged with the upper end of the housing-mounting portion 56, so that the bus bars and the control circuit board 20 are retained relative to the casing 50.

In this structure, connectors, provided, for example, at ends of wire harnesses installed on a vehicle, are connected respectively to the connectors formed respectively by the housings 40 and 54 and their associated terminals, and by doing so, these terminals can be easily connected to the external circuits.

A plurality of fin cover portions 58, juxtaposed in a right-left direction, project downwardly from each of opposite (front and rear) ends of the casing 50.

8) Radiating Member-Connecting Step

An upper surface 64 of the radiating member 60, shown in FIG. 10, is bonded to the lower surfaces of the bus bars, so that the bus bars are joined to this radiating member.

The radiating member 60 is made of a material of good thermal conductivity, such as aluminum-base metal, and has the flat upper surface 64, and a plurality of fins 62, juxtaposed in a right-left direction, project downwardly from a lower surface of this radiating member. The positions of the fins 62 correspond to the positions of the fin cover portions 58, and therefore when the radiating member 60 is attached, opposite ends of the fins 62 are covered with the fin cover portions 58.

9) Potting Step

A potting agent is poured into the interior of the cover-mounting wall 52 through the upper opening thereof, thereby sealing the FETs 30 in this potting agent. Thereafter, a cover 70, shown in FIG. 11, is fitted on the upper edge of the cover-mounting wall 52, and the two are joined together (for example, by vibration welding), thereby sealing the interior of the cover-mounting wall 52. As a result, the waterproof effect of the circuit-constituting unit is further enhanced.

In the thus produced power distributor, the power source is connected to the input terminals (the end portions 11a of the input terminal bus bars 11), and the electrical loads are connected to the output terminals (the end portions 12a of the output terminal bus bars 12), and by doing so, there is built the distribution circuit for distributing electric power from the power source to the suitable electrical loads, and the operation of the FETs 30, provided in the distribution circuit, is controlled by the control circuit incorporated in the control circuit board 20, so that the on/off control for the energization of the distribution circuit is effected.

Figure 8:
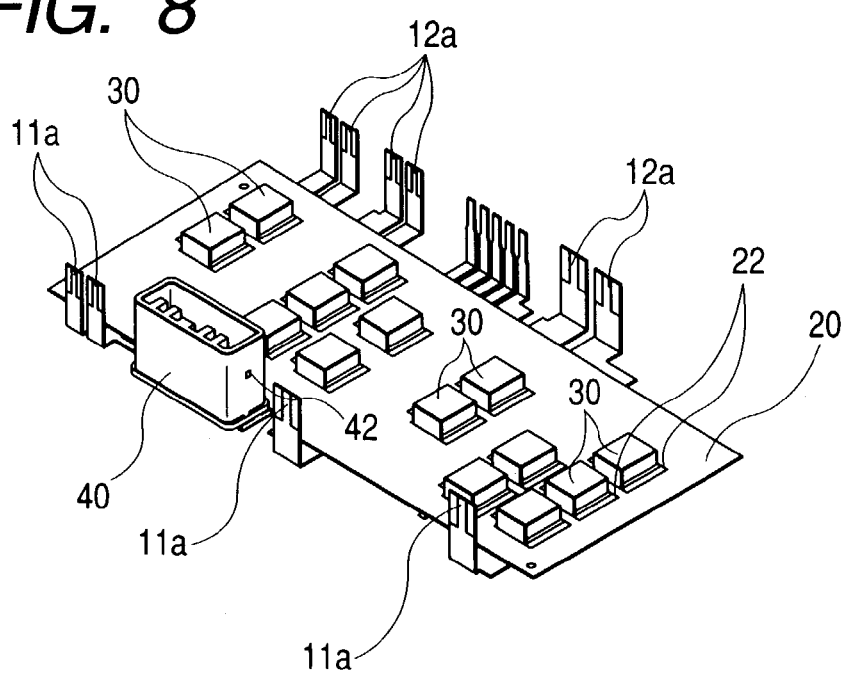
FIG. 8 is a perspective view showing a condition in which the bus bars are separated from each other by removing an outer frame from the bus bar-forming plate.

In the circuit-constituting unit shown here, the control circuit board 20 has the thin sheet-like configuration, and therefore can be easily flexed, for example, in the condition of FIG. 8, and such flexing is liable to occur particularly at those portions thereof where the bus bars are not provided. Therefore, unless any countermeasures are taken, the flexing with a large curvature would develop between the adjacent bus bars, and there is a fear that those portions of the FET 30 (mounted on the two bus bars in straddling relation to the gap therebetween), soldered to the two bus bars, are separated therefrom, so that the incomplete connection occurs.

The small gap is formed, for example, between the input terminal bus bar 11A and the relay bus bar 13 shown in FIGS. 17, 18A, 18B, 19A and 19B, and the FETs 30 are mounted on these bus bars 11A and 13 in straddling relation to this gap. Therefore, the flexing with a large curvature would develop between the two bus bars 11A and 13, and there is a fear that those portions of the FET 30, soldered to the two bus bars 11A and 13, are separated therefrom, so that the incomplete connection occurs at this portion.

Therefore, in this embodiment, there is provided a flexure-suppressing bus bar for suppressing the flexing of the insulative base member at the region between the specified bus bars, and this flexure-suppressing bus bar is provided at a region offset from the region, at which the FETs 30 are mounted, in a direction perpendicular to the direction (right-left direction in FIGS. 18A and 18B) of juxtaposing of the bus bars 11A and 13, and extends in a direction generally parallel to this juxtaposing direction. More specifically, as indicated by dots-and-dash lines in FIG. 17 and shown in FIGS. 18B and 19B, a flexure-suppressing portion 11e extends from the end of the input terminal bus bar 11A in the direction generally parallel to the direction of juxtaposing of the two bus bars 11A and 13, that is, in the direction (left direction in FIG. 18B) transverse relative to the relay bus bar 13. The flexing of the control circuit board 20 between the input terminal bus bar 11A and the relay bus bar 13 is suppressed by the rigidity of the flexure-suppressing portion 11e. Namely, the input terminal bus bar 11A serves also as the flexure-suppressing bus bar.

With this simple construction in which the flexure-suppressing portion 11e is merely extended from the input terminal bus bar 11A, the incomplete connection of the FETs 30 due to the flexing of the control circuit board 20 can be prevented.

In the present invention, the flexure-suppressing bus bar is not limited to the extension portion of the input terminal bus bar 11A, and for example a bus bar (extending in a direction parallel to the two bus bars 11A and 13), which is completely independent of the two bus bars 11A and 13, may be provided between the two bus bars 11A and 13 at such a position as to suppress the flexing of the control circuit board 20. A portion whose flexing is to be suppressed by the flexure-suppressing bus bar can be suitably determined, and a flexure-suppressing bus bar may be provided between the input terminal bus bar 11 and the output terminal bus bar 12 at such a position as to suppress the flexing of the control circuit board.

The insulative base member is not limited to the type constituting the control circuit board 20 as in the above embodiment, and for example it may be merely in the form of an insulative sheet having the bus bars bonded to a surface thereof.

As described above, the circuit-constituting unit of the present invention, the plurality of bus bars are bonded to the surface of the sheet-like insulative base member, and the circuit element is mounted on the two specified bus bars in straddling relation to the gap therebetween, thereby forming the power circuit, and therefore the thin design thereof can be achieved. And besides, the bus bars, bonded to the surface of the insulative base member, include the flexure-suppressing bus bar for suppressing the flexing of the insulative base member between the specified bus bars, and this flexure-suppressing bus bar is provided at the region offset from the region, at which the circuit element is mounted, in the direction perpendicular to the direction of juxtaposing of the specified bus bars, and extends in the direction generally parallel to this juxtaposing direction. Therefore, there is achieved an advantageous effect that the mounded condition of the circuit element can be kept good by suppressing this flexing or deformation.

What is claimed is:

1. A circuit-constituting unit comprising:
a plurality of bus bars for constituting a power circuit,
a semiconductor switching device provided in the power circuit, and
a control circuit board for controlling the driving of the semiconductor switching device;
wherein
the bus bars are bonded to a surface of the control circuit board such that the bus bars are arranged to be generally coplanar with each other; and
the semiconductor switching device is mounted on both of the corresponding bus bars and the control circuit board;
wherein
an opening is formed through the control circuit board;
the semiconductor switching device includes a plurality of terminals;
at least one of the terminals is connected to a surface of the control circuit board facing away from the surface thereof to which the bus bars are bonded; and
the other one of the terminals is connected respectively to the bus bar through the opening.

2. The circuit-constituting unit according to claim 1, wherein
the semi-conductor switching device has the current-flowing terminal provided on a reverse surface of a body thereof;
the control circuit board has an opening having such a size as to allow the body of the semiconductor switching device to be passed therethrough; and
the body of the semiconductor switching device is mounted on the bus bar such that the current-flowing terminal is held in contact with the bus bar through the opening.

3. The circuit-constituting unit according to claim 1, wherein
the bus bars project from side edges of the control circuit board to form terminals for connection to external circuits.

4. The circuit-constituting unit according to claim 1, further comprising: a radiating member;
wherein
the radiating member is provided at a side of the bus bars facing away from the control circuit board such that the bus bars are interposed between the radiating member and the control circuit board; and
the bus bars are connected to the radiating member through an insulating layer.

5. The circuit-constituting unit according to claim 1, wherein the control circuit board includes a control circuit that controls a switching operation of a semiconductor switching device, and the bus bars are electrically connected to the control circuit.

6. The circuit-constituting unit according to claim 1, wherein the semiconductor switching device is electrically connected to both of the corresponding bus bars and the control circuit board.

7. The circuit-constituting unit according to claim 3, wherein
the bus bars forming the terminals, are bent to extend in the same direction generally perpendicular to the control circuit board.

8. The circuit-constituting unit according to claim 3, wherein
the terminals include input terminals to be connected to a power source, and a plurality of output terminals to be connected to electrical loads; and
the bus bars form a distribution circuit which feeds electric power supplied to the input terminals from the output terminals to said electrical loads.

9. The circuit-constituting unit according to claim 3, wherein
the terminals include signal input terminals to which instruction signals are inputted from the exterior;
the control circuit board includes a control circuit; and the bus bars which form the signal input terminals are electrically connected to the control circuit.

10. The circuit-constituting unit according to claim 7, further comprising a connector;
wherein
the connector includes a housing made of an insulative material; and
the housing is disposed in surrounding relation to the terminal.

11. The circuit-constituting unit according to claim 10, further comprising: a casing made of an insulative material;
wherein
the casing accommodates the bus bars and the control circuit board; and
the housing is formed integrally with the casing.

12. The circuit-constituting unit according to claim 11, wherein
the casing includes an upstanding waterproof wall surrounding a region including the semiconductor switching device;
an interior of said closed waterproof wall is sealed by a potting agent; and
the waterproof wall has an opening closed by a cover.

13. A circuit-constituting unit comprising:
a plurality of bus bars for constituting a power circuit;
a semiconductor switching device provided in the power circuit; and
a control circuit board for controlling the driving of the semiconductor switching device,
wherein
the bus bars are arranged at a surface of the control circuit board such that the bus bars are arranged to be generally coplanar with each other; and
the semiconductor switching device is mounted on, and electrically connected to, both of the corresponding bus bars and the control circuit board;
wherein
an opening is formed through the control circuit board;
the semiconductor switching device includes a plurality of terminals;
at least one of the terminals is connected to a surface of the control circuit board facing away from the surface thereof to which the bus bars are bonded; and
the other one of the terminals is connected respectively to the bus bar through the opening.

14. The circuit-constituting unit according to claim 13, wherein
the semi-conductor switching device has the current-flowing terminal provided on a reverse surface of a body thereof;

the control circuit board has an opening having such a size as to allow the body of the semiconductor switching device to be passed therethrough; and the body of the semiconductor switching device is mounted on the bus bar such that the current-flowing terminal is held in contact with the bus bar through the opening.

15. The circuit-constituting unit according to claim 13, wherein the bus bars project from side edges of the control circuit board to form terminals for connection to external circuits.

16. The circuit-constituting unit according to claim 13, further comprising: a radiating member;

wherein the radiating member is provided at a side of the bus bars facing away from the control circuit board such that the bus bars are interposed between the radiating member and the control circuit board; and the bus bars are connected to the radiating member through an insulating layer.

17. The circuit-constituting unit according to claim 15, wherein the bus bars forming the terminals, are bent to extend in the same direction generally perpendicular to the control circuit board.

18. The circuit-constituting unit according to claim 15, wherein the terminals include input terminals to be connected to a power source, and a plurality of output terminals to be connected to electrical loads; and the bus bars form a distribution circuit which feeds electric power supplied to the input terminals from the output terminals to said electrical loads.

19. The circuit-constituting unit according to claim 15, wherein the terminals include signal input terminals to which instruction signals are inputted from the exterior;

the control circuit board includes a control circuit; and the bus bars which form the signal input terminals are electrically connected to the control circuit.

20. The circuit-constituting unit according to claim 17, further comprising a connector;

wherein the connector includes a housing made of an insulative material; and the housing is disposed in surrounding relation to the terminal.

21. The circuit-constituting unit according to claim 20, further comprising: a casing made of an insulative material;

wherein the casing accommodates the bus bars and the control circuit board; and the housing is formed integrally with the casing.

22. The circuit-constituting unit according to claim 21, wherein the casing includes an upstanding waterproof wall surrounding a region including the semiconductor switching device;

an interior of said closed waterproof wall is sealed by a potting agent; and the waterproof wall has an opening closed by a cover.

* * * * *

UNITED STATES PATENT AND TRADEMARK OFFICE
CERTIFICATE OF CORRECTION

PATENT NO. : 7,167,377 B2
APPLICATION NO. : 10/302968
DATED : January 23, 2007
INVENTOR(S) : Takahiro Onizuka et al.

It is certified that error appears in the above-identified patent and that said Letters Patent is hereby corrected as shown below:

On The Title Page,
Item (73), please change "Sumitoo Wiring Systems, Ltd." To --Sumitomo Wiring Systems, Ltd.--

Signed and Sealed this

First Day of April, 2008

JON W. DUDAS
*Director of the United States Patent and Trademark Office*